(12) United States Patent
Shieh et al.

(10) Patent No.: US 8,881,066 B2
(45) Date of Patent: Nov. 4, 2014

(54) MANDREL MODIFICATION FOR ACHIEVING SINGLE FIN FIN-LIKE FIELD EFFECT TRANSISTOR (FINFET) DEVICE

(75) Inventors: Ming-Feng Shieh, Yongkang (TW);
Yi-Tang Lin, Hsinchu (TW);
Chia-Cheng Ho, Hsinchu (TW);
Chih-Sheng Chang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/339,646

(22) Filed: Dec. 29, 2011

(65) Prior Publication Data
US 2013/0174103 A1   Jul. 4, 2013

(51) Int. Cl.
*G06F 17/50* (2006.01)

(52) U.S. Cl.
USPC .............................. 716/51; 716/55

(58) Field of Classification Search
CPC ........ G03F 1/144; G03F 1/36; G03F 17/5068
USPC ....................................... 716/51, 55
See application file for complete search history.

(56) References Cited

U.S. PATENT DOCUMENTS

2011/0108961 A1* 5/2011 Cheng et al. ............... 257/623

* cited by examiner

*Primary Examiner* — Suresh Memula
(74) *Attorney, Agent, or Firm* — Haynes and Boone, LLP

(57) ABSTRACT

Methods for forming a single fin fin-like field effect transistor (FinFET) device are disclosed. An exemplary method includes providing a main mask layout and a trim mask layout to form fins of a fin-like field effect transistor (FinFET) device, wherein the main mask layout includes a first masking feature and the trim mask layout includes a second masking feature that defines at least two fins, the first masking feature and the second masking feature having a spatial relationship; and modifying the main mask layout based on the spatial relationship between the first masking feature and the second masking feature, wherein the modifying the main mask layout includes modifying the first masking feature such that a single fin FinFET device is formed using the modified main mask layout and the trim mask layout.

20 Claims, 25 Drawing Sheets

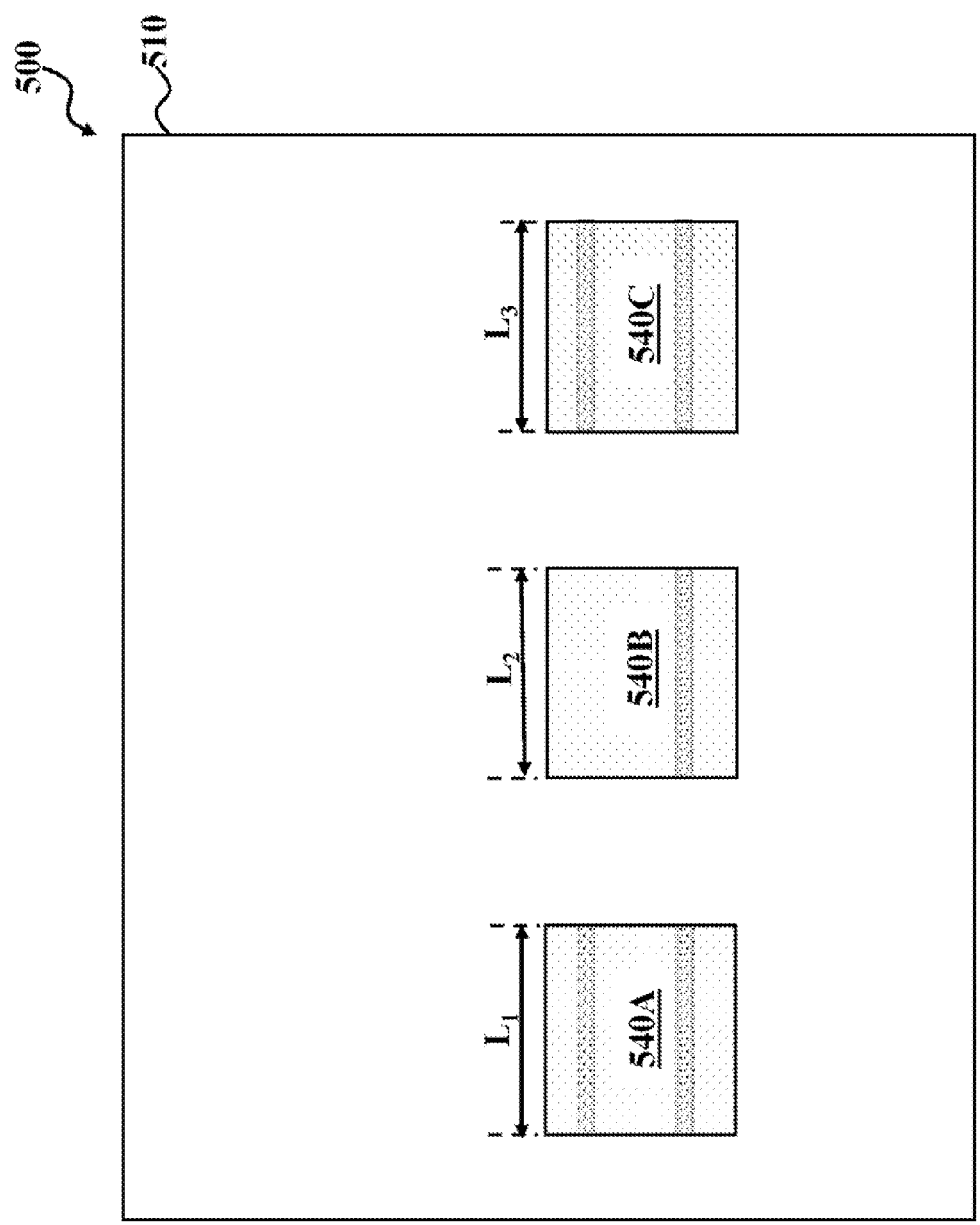

US 8,881,066 B2

MANDREL MODIFICATION FOR ACHIEVING SINGLE FIN FIN-LIKE FIELD EFFECT TRANSISTOR (FINFET) DEVICE

BACKGROUND

Integrated circuit (IC) technologies are constantly being improved. Such improvements frequently involve scaling down device geometries to achieve lower fabrication costs, higher device integration density, higher speeds, and better performance. Lithography is frequently used for forming components of an integrated circuit device, where generally, an exposure tool passes light through a mask or reticle and focuses the light onto a resist layer of a wafer, resulting in the resist layer having an image of integrated circuit components therein. Forming device patterns with smaller dimensions is limited by a resolution of the exposure tool. For example, forming fin-like field effect (FinFET) devices with less than two fins is limited by current lithography resolution limits. Accordingly, although existing lithography techniques have been generally adequate for their intended purposes, as device scaling down continues, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for only illustration purposes. In fact, the dimensions of the various features may be arbitrarily increased or reduced for clarity of discussion.

FIGS. 1A-1I are top views of an integrated circuit device 100 during various stages of fabrication according to various aspects of the present disclosure.

FIGS. 5A-5G are top views of an integrated circuit device during various stages of fabrication using the integrated circuit design layout of FIG. 4 according to various aspects of the present disclosure.

DETAILED DESCRIPTION

Figure 1A:
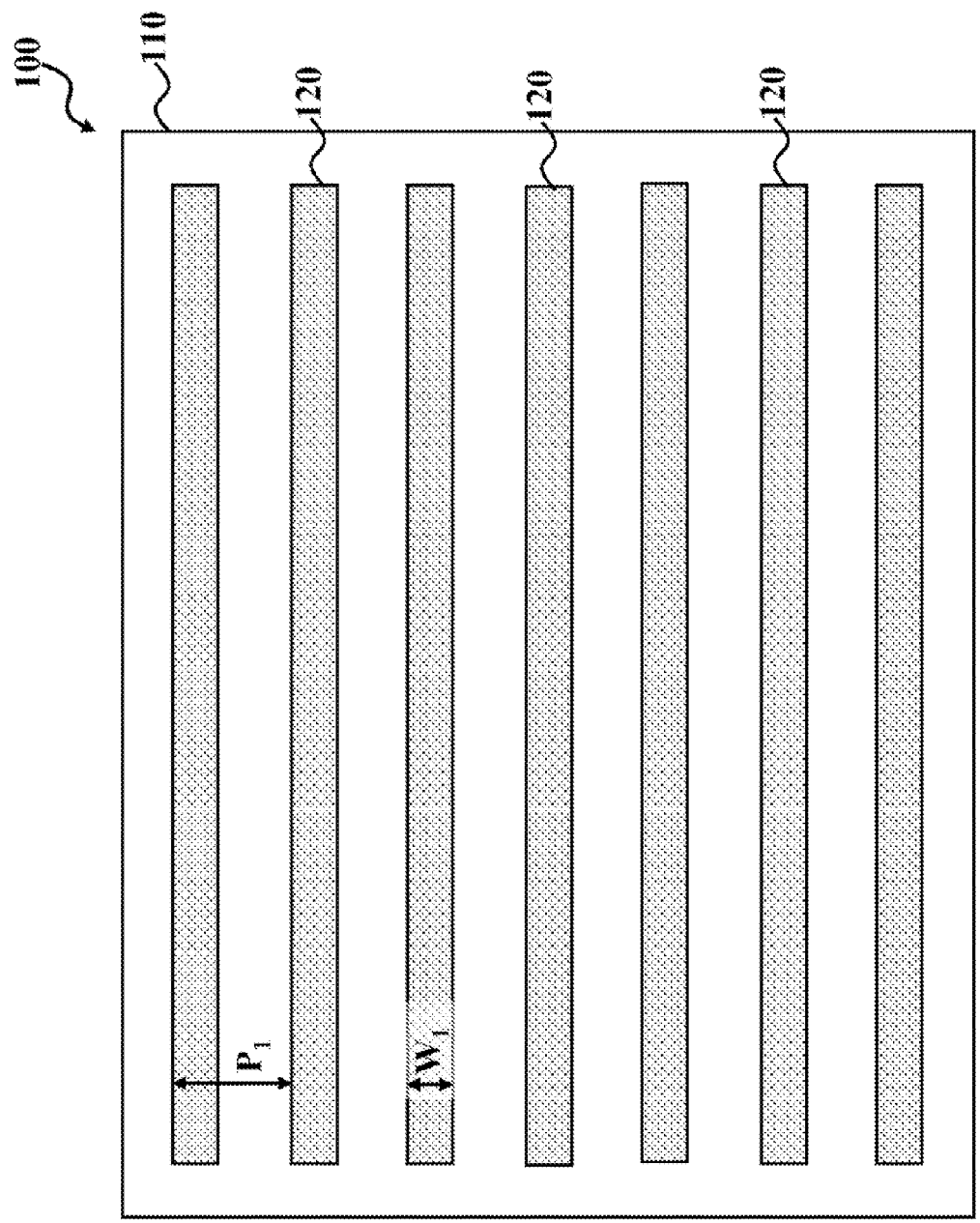

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIGS. 1A-1I are top views of an integrated circuit device 100 during various stages of fabrication according to various aspects of the present disclosure. The integrated circuit device 100 is an integrated circuit (IC) chip, system on chip (SoC), or portion thereof, that includes various passive and active microelectronic components, such as resistors, capacitors, inductors, diodes, metal-oxide-semiconductor field effect transistors (MOSFETs), complementary MOS (CMOS) transistors, bipolar junction transistors (BJTs), laterally diffused MOS (LDMOS) transistors, high power MOS transistors, fin-like field effect transistors (FinFETs), other suitable components, or combinations thereof. In the depicted embodiment, as further discussed below, the integrated circuit device 100 includes various FinFET devices, and the integrated circuit device 100 is illustrated during various stages of FinFET device fabrication. The term FinFET device refers to any fin-based, multi-gate transistor. FIGS. 1A-1I will be discussed concurrently and have been simplified for the sake of clarity to better understand the inventive concepts of the present disclosure. Additional features can be added in the integrated circuit device 100, and some of the features described below can be replaced or eliminated in other embodiments of the integrated circuit device 100.

Figure 1B:
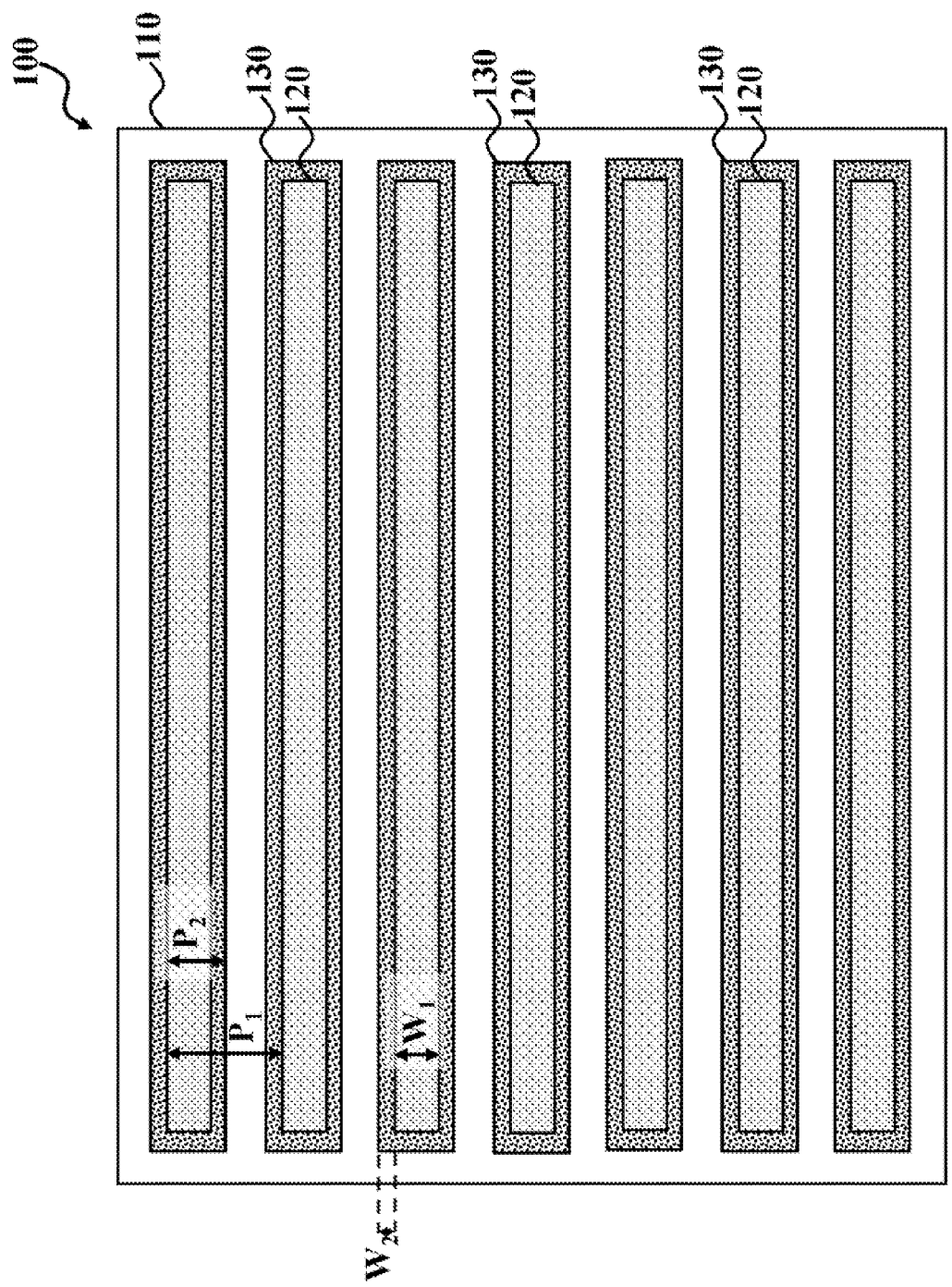
Figure 1C:
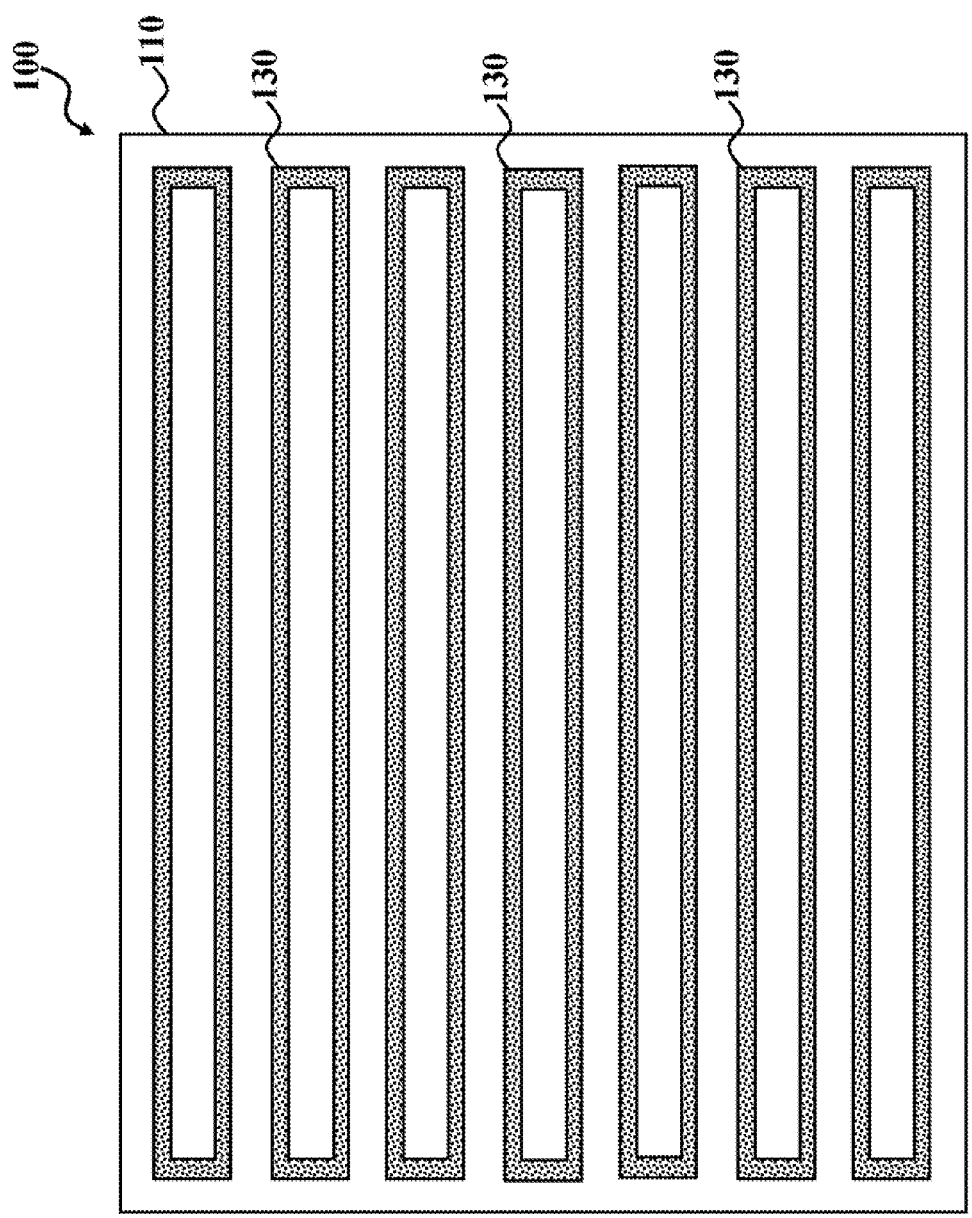

In FIGS. 1A-1C, a first or main masking process is performed to define a width and a pitch of fins of various fin structures of the integrated circuit device 100, where the fin structures are included in various FinFET devices. In FIG. 1A, a substrate 110 is provided. In the present example, the substrate 110 is a semiconductor substrate including silicon. Alternatively or additionally, the substrate 110 includes an elementary semiconductor, such as germanium; a compound semiconductor, such as silicon carbide, gallium arsenide, gallium phosphide, indium phosphide, indium arsenide, and/or indium antimonide; or combinations thereof. Alternatively, the substrate 110 is a silicon-on-insulator (SOI) substrate, which can be fabricated using separation by implantation of oxygen (SIMOX), wafer bonding, or other methods. The substrate 110 may include various doped regions and other suitable features.

An array of mandrels 120 are disposed over the substrate 110, where adjacent mandrels 120 are spaced from one another by a pitch, $P_1$, and each mandrel 120 has a width, $W_1$. The mandrels 120 include a patterning or masking material, such as a resist material, polysilicon, silicon oxide, silicon nitride, other patterning or masking material, or combinations thereof. In an example, forming the mandrels 120 includes depositing a patterning or masking layer (such as a polysilicon layer) over the substrate 110; forming a resist layer over the masking layer; using a mandrel mask (which may be referred to as a main mask) to expose the resist layer to radiation, thereby forming exposed portions of the resist layer and unexposed portions of the resist layer; removing the exposed portions or unexposed portions of the resist layer (for example, by subjecting the exposed resist layer to a developing solution), thereby forming a patterned resist layer that exposes portions of the masking layer; and using the patterned resist layer to etch the masking layer, specifically, the exposed portions of the masking layer, to form the mandrels 120 as illustrated in FIG. 1A. In other examples, the mandrels 120 are formed by various deposition processes, lithography processes, etching processes, or combinations thereof. The deposition processes include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other deposition methods, or combinations thereof. The lithography processes may include resist coating (for example, spin-on coating), soft baking, mask aligning, exposure, post-exposure baking, developing the resist, rinsing, drying (for example, hard baking), other lithography process, or combinations thereof. Alternatively, the lithography processes can be implemented or replaced by other methods, such as maskless lithography, electron-beam writing, ion-beam writing, and/or nanoimprint technology. The etching processes include dry etching, wet etching, other etching methods, or combinations thereof.

In FIG. 1B, spacers 130 are formed over the substrate 110, such that each of the mandrels 120 is surrounded by a spacer 130; and in FIG. 1C, the mandrels 120 are removed, for example, by an etching process, such that the spacers 130 remain disposed over the substrate 110. The spacers 130 include a patterning or masking material, such as a resist material, polysilicon, silicon oxide, silicon nitride, other patterning or masking material, or combinations thereof. In the depicted embodiment, the spacers 130 include silicon nitride. The spacers 130 are formed by various deposition processes, lithography processes, etching processes, or combinations thereof, such as the processes described herein. The spacers 130 on opposite sidewalls of each mandrel 120 have a width, $W_2$, that is less than the width, $W_1$, of each mandrel 120. The spacers on opposite sidewalls of each mandrel 120 are also spaced from one another by a pitch, $P_2$, that is less than the pitch, $P_1$, of the mandrels 120. As further described below, the spacers 130 are used to form the fin structures of the integrated circuit device 100, such that the the pitch, $P_2$, and the width, $W_2$, of the spacers 130 define the width and the pitch of various fin structures of the integrated circuit device 100.

Figure 1D:
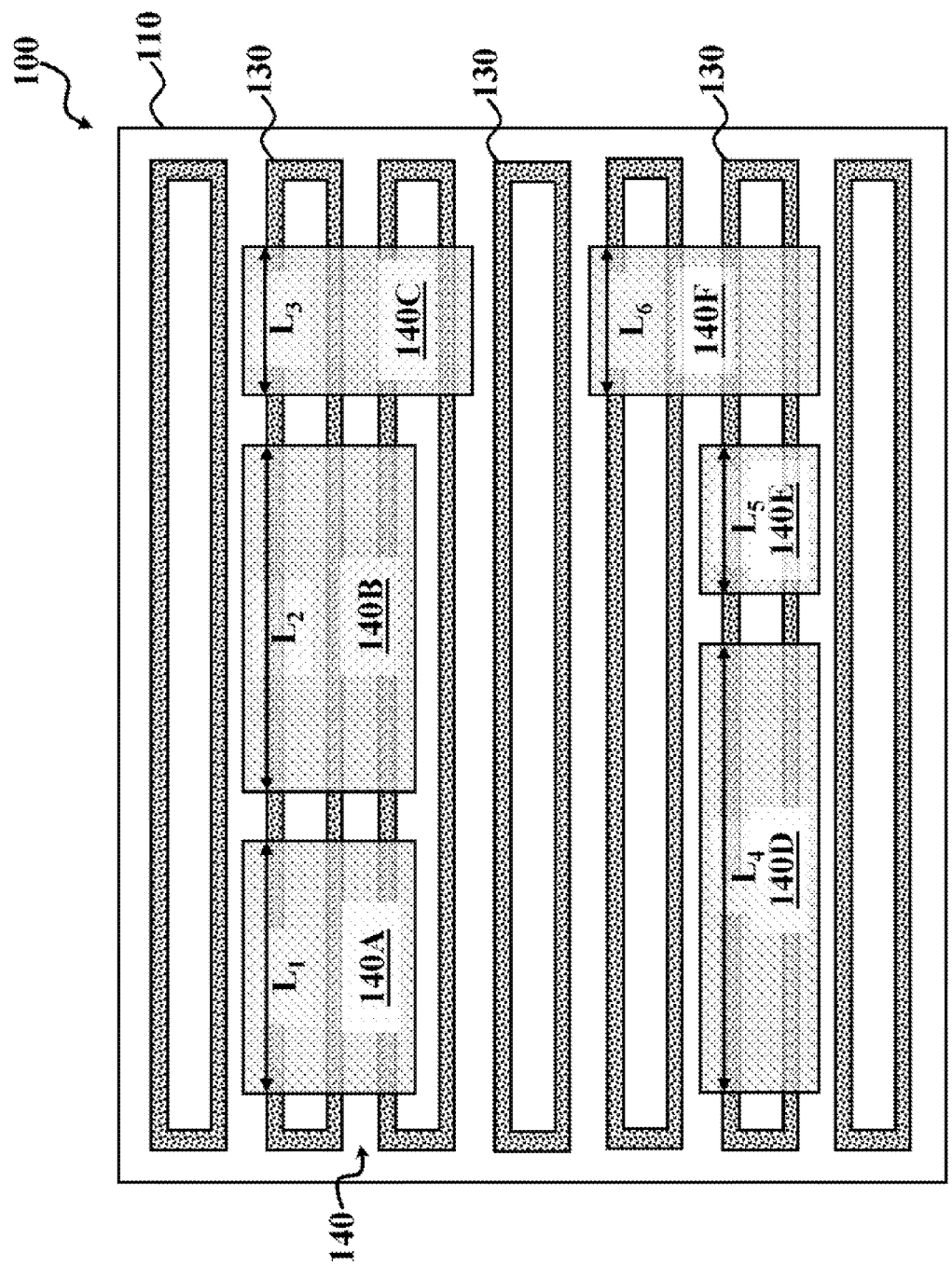

In FIGS. 1D-1G, a second or trim (or cut) masking process is performed to define lengths of the fins of the various fin structures of the integrated circuit device 100. In FIG. 1D, an trim masking layer that includes array of trim mask portions 140A, 140B, 140C, 140D, 140E, and 140F is disposed over the substrate 110. Each trim mask portion 140A, 140B, 140C, 140D, 140E, and 140F defines a FinFET device area of the integrated circuit device 100. More specifically, in the depicted embodiment, each trim mask portion 140A, 140B, 140C, 140D, 140E, and 140F defines a number of fins that a fin structure of a FinFET device of the integrated circuit device 100 will include and a length of the fins of the fin structure of the respective FinFET device (such as length, $L_1$; length, $L_2$; length, $L_3$; length, $L_4$; length, $L_5$; length, $L_6$). The trim masking layer 140 includes a patterning or masking material, such as a resist material, polysilicon, silicon oxide, silicon nitride, other patterning or masking material, or combinations thereof. In the depicted embodiment, the trim masking layer 140 includes a resist material. In an example, forming the trim masking layer 140 includes depositing a resist layer over the substrate 110; using a trim mask (which may be referred to as an active region mask) to expose the resist layer to radiation, thereby forming exposed portions of the resist layer and unexposed portions of the resist layer; removing the exposed portions or unexposed portions of the resist layer (for example, by subjecting the exposed resist layer to a developing solution), thereby forming a patterned resist layer, specifically the trim masking layer 140 as illustrated in FIG. 1D that provides unexposed portions of the spacers 130 and exposed portions of the spacers 130. In the depicted embodiment, the trim masking layer 140 includes the trim mask portions 140A, 140B, 140C, 140D, 140E, and 140F that covers portions of the spacers 130, thereby providing the unexposed portions of the spacers 130. In other examples, the trim masking layer 140 is formed by various deposition processes, lithography processes, etching processes, or combinations thereof, such as the processes described herein.

Figure 1E:
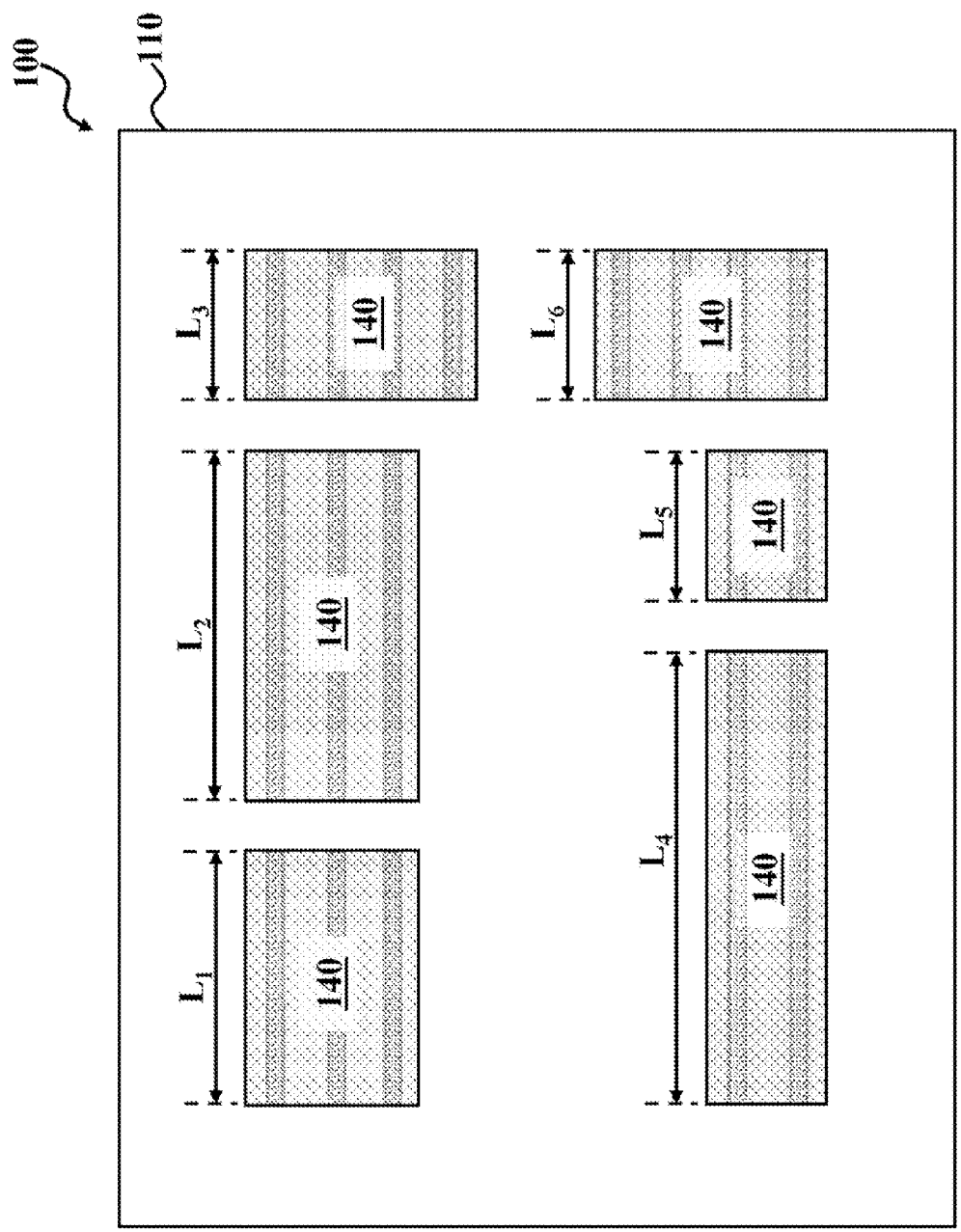
Figure 1F:
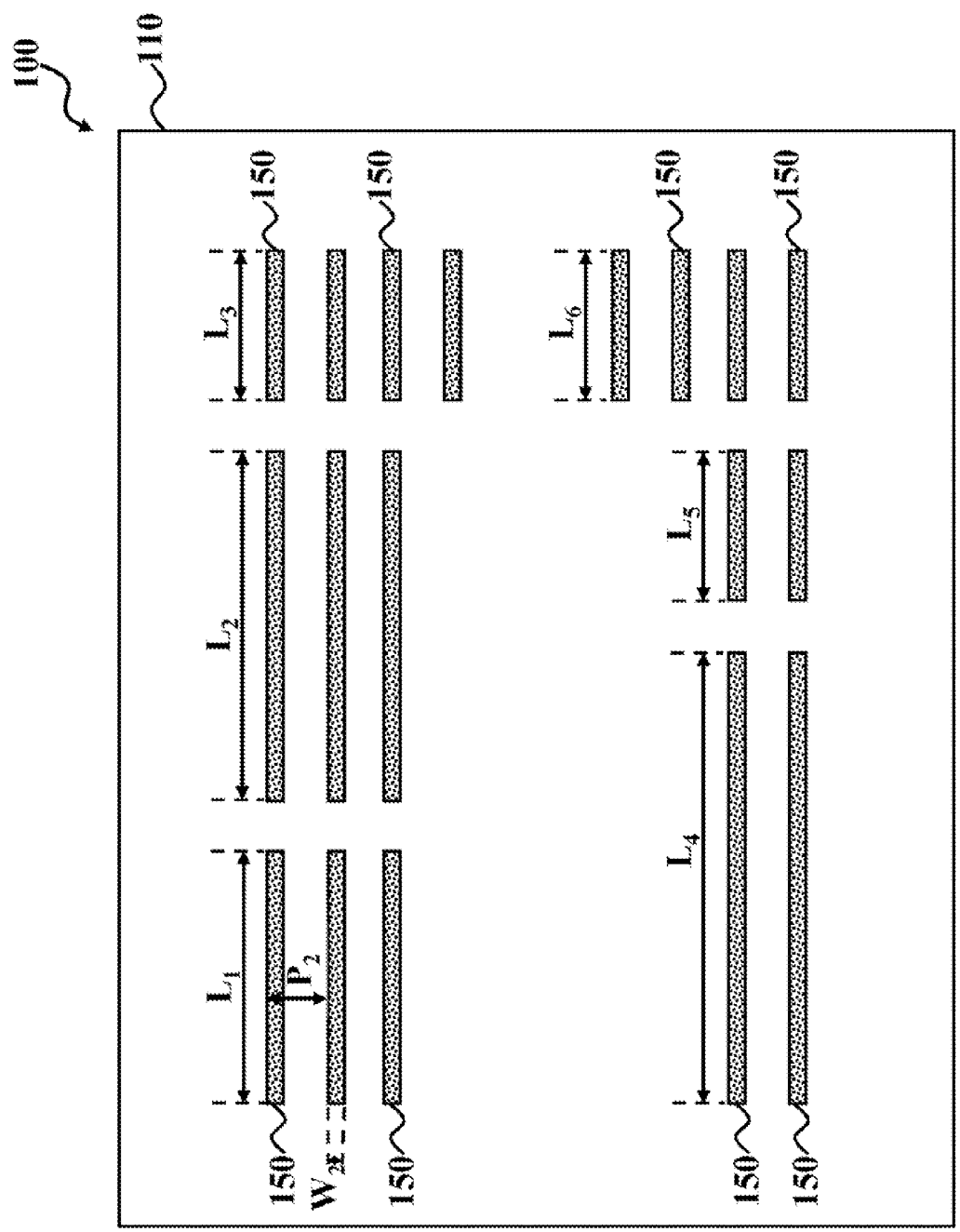
Figure 1G:
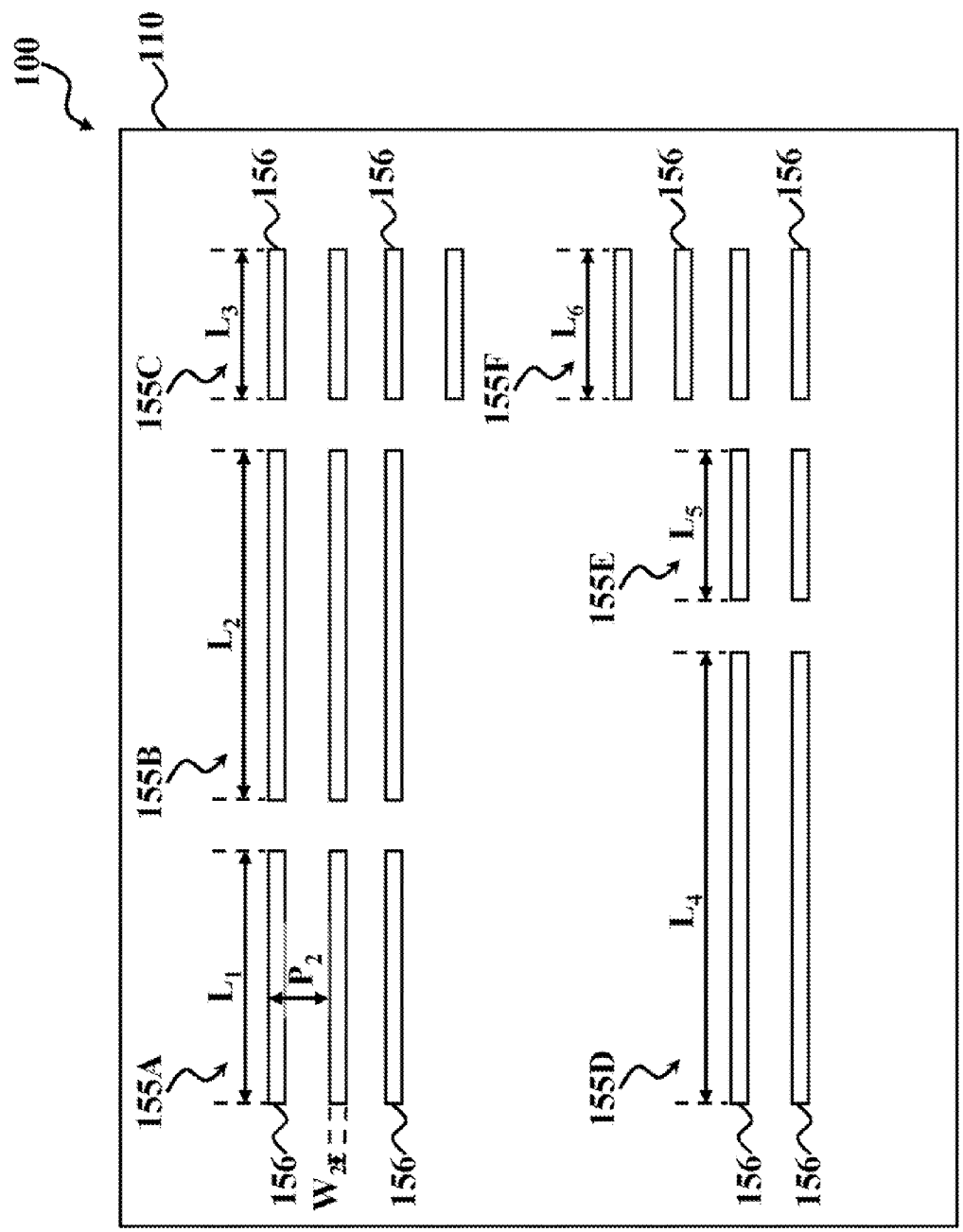

In FIG. 1E, the exposed portions of the spacers 130 are removed, for example, by an etching process; and in FIG. 1F, the trim masking layer 140 is removed, leaving spacer segments 150 disposed over the substrate 110. Each spacer segment 150 has the width, $W_2$; adjacent spacer segments 150 are spaced by the pitch, $P_2$; and each spacer segment 150 has the length, $L_1$, length, $L_2$, length, $L_3$, length, $L_4$, length, $L_5$, or length, $L_6$. The spacer segments 150 leave exposed portions of the substrate 110 and unexposed portions of the substrate 110. In FIG. 1G, the spacer segments 150 are used as a mask to remove the exposed portions of the substrate 110 (for example, by an etching process), thereby forming FinFET device areas 155A, 155B, 155C, 155D, 155E, and 155F. Each FinFET device area 155A, 155B, 155C, 155D, 155E, and 155F includes a fin structure having fins 156 that extend from the substrate 110. In the depicted embodiment, the FinFET device area 155A includes a fin structure having three fins 156 having the length, $L_1$; the FinFET device area 155B includes a fin structure having three fins 156 having the length, $L_2$; the FinFET device area 155C includes a fin structure having four fins 156 having the length, $L_3$; the FinFET device area 155D includes a fin structure having two fins 156 having the length, $L_4$; the FinFET device area 155E includes a fin structure having two fins 156 having the length, $L_5$; and the FinFET device area 155F includes a fin structure having four fins 156 having the length, $L_6$. The fins 156 in each of the FinFET device areas 155A, 155B, 155C, 155D, 155E, and 155F have the width, $W_2$; and adjacent fins 156 in each of the FinFET device areas 155A, 155B, 155C, 155D, 155E, and 155F are spaced by the pitch, $P_2$.

Figure 1H:
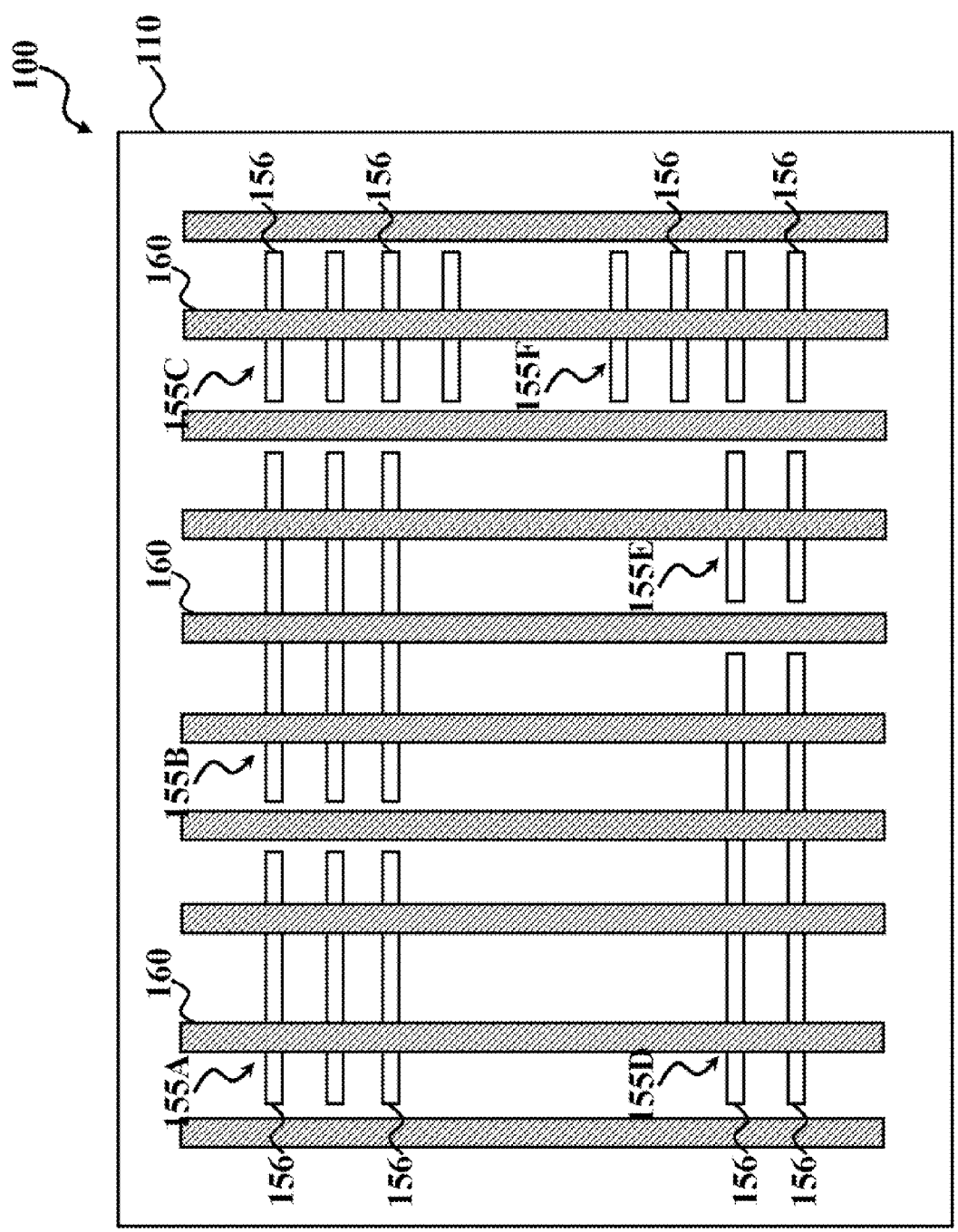
Figure 11:
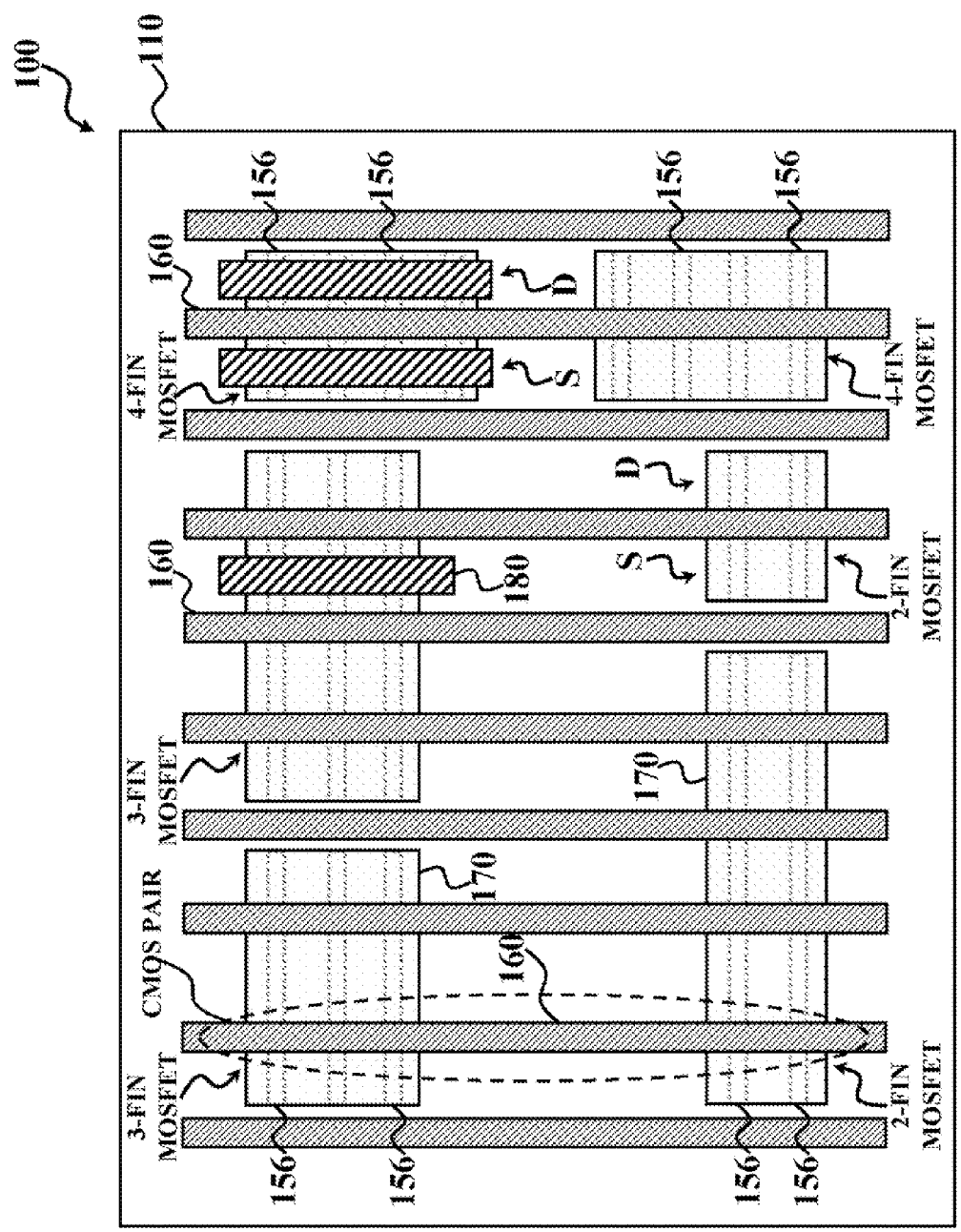

In FIG. 1H, gate structures 160 are formed over the substrate 110, such that the gate structures 160 traverse the fins 156 of the various FinFET device areas 155A, 155B, 155C, 155D, 155E, and 155F. The gate structures 160 are formed by deposition processes, lithography patterning processes, etching processes, other processes, or combinations thereof, such as the processes described herein. The gate structures 160 include a gate stack that includes a gate dielectric and a gate electrode. The gate stack of the gate structures 160 may include numerous other layers, for example, capping layers, interface layers, diffusion layers, barrier layers, hard mask layers, or combinations thereof. The gate dielectric includes a dielectric material, such as silicon oxide, a high-k dielectric material, other dielectric material, or combinations thereof. Examples of high-k dielectric material include $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other high-k dielectric materials, or combinations thereof. The gate electrode includes polysilicon and/or a metal including Al, Cu, Ti, Ta, W, Mo, TaN, NiSi, CoSi, TiN, WN, TiAl, TiAlN, TaCN, TaC, TaSiN, other conductive materials, or combinations thereof. The gate structure 160 may further include spacers. The spacers are disposed on sidewalls of the gate stack of the gate structure 160, such as along sidewalls of the gate dielectric and the gate electrode. The spacers include a dielectric material, such as silicon oxide, silicon nitride, silicon oxynitride, other suitable material, or combinations thereof. The spacers may include a multi-layer structure, such as a multi-layer structure including a silicon nitride layer and a silicon oxide layer.

In FIG. 1I, epitaxial features 170 are formed over the substrate 110. The epitaxial may define source (S) and drain (D) regions. The epitaxial features 170 are disposed over each fin 156 of the fin structures. The epitaxial features 170 are formed by epitaxially (epi) growing a semiconductor material on the fins 156. The epitaxy process may use CVD deposition techniques (such as vapor-phase epitaxy (VPE) and/or ultra-high vacuum CVD (UHV-CVD)), molecular beam epitaxy, other suitable processes, or combinations thereof. The epitaxy process may use gaseous and/or liquid precursors. The epitaxial features 170 may include silicon germanium (SiGe) formed by a silicon germanium epitaxial process, silicon formed by a silicon epitaxial process, or other epitaxially grown material. The epitaxial features 170 may be doped during deposition (growth) by adding impurities to the source material of the epitaxy process or subsequent to its deposition growth process by an ion implantation process. For example, the silicon germanium epitaxial features may be doped with boron, and the silicon epitaxial features may be doped with carbon. The doped epitaxial layer may have a gradient doping profile. A chemical mechanical polishing (CMP) process may be performed to planarize the epitaxial features 170.

Various conductive features 180 are also formed over the substrate 110. The metal lines 180 are disposed over the epitaxial features 170. The conductive features 180 include a conductive material, such as aluminum, copper, titanium, tantalum, tungsten, other conductive material, alloys thereof, silicides thereof, or combinations thereof. In an example, the conductive features 180 are a portion of a multilayer interconnect (MLI) structure (including various conductive and dielectric layers) that can be formed over the substrate 110, configured to connect the various features or structures of the device 100. For example, the MLI structure may provide electrical interconnection to the various features of the integrated circuit device 100. The MLI structure includes vertical interconnect features, such as vias or contacts, and horizontal interconnect features, such as conductive lines, such as the conductive features 180. The various MLI features include various conductive materials. In an example, a damascene or dual damascene process is used to form the MLI structure.

The integrated circuit device 100 includes six FinFET devices. More specifically, a three-fin metal-oxide-semiconductor field effect transistor (MOSFET) device corresponds with FinFET device area 155A; a three-fin MOSFET device corresponds with FinFET device area 155B; a four-fin MOSFET device corresponds with FinFET device area 155C; a two-fin MOSFET device corresponds with FinFET device area 155D; a two-fin MOSFET device corresponds with FinFET device area 155E; and a four-fin MOSFET device corresponds with FinFET device area 155F. The three-fin MOSFET device corresponding with FinFET device area 155A and the two-fin MOSFET device corresponding with FinFET device area 155D may be referred to as a complementary metal-oxide-semiconductor (CMOS) pair. In an example, where the three-fin MOSFET devices corresponding with FinFET device area 155A are configured as p-type MOSFETS, and the two-fin MOSFET device corresponding with FinFET device area 155D are configured as n-type MOSFETS, a p/n ratio of the CMOS pair is 3/2.

In FIGS. 1A-1I, the FinFET device fabrication process thus fabricates various FinFET devices of the integrated circuit device 100, where each of the FinFET devices includes fin structures having at least two fins. In some situations, a FinFET device that includes a fin structure having a single fin is desired, for example, to reduce power consumption of the integrated circuit device, reduce FinFET device area of the integrated circuit device, or achieve a specially designed integrated circuit device (such as an optimized p/n ratio of a CMOS pair of FinFET devices). The single fin FinFET device requires less turn on current and thus less turn off leakage and parasitic capacitance than FinFET devices having fin structures with at least two fins, which is advantageous in some integrated circuit devices. Currently, because of lithography resolution limits, the FinFET device fabrication process illustrated in FIGS. 1A-1I cannot form a single fin FinFET device. More specifically, dimensions of the trim mask portions 140A, 140B, 140C, 140D, 140E, and 140F used to define a number of fins of the various FinFET devices (such as a width of the trim mask portions 140A, 140B, 140C, 140D, 140E, and 140F) is limited by lithography resolution limits. Accordingly, integrated circuit device manufacturing is often limited to integrated circuit devices having FinFET devices that include fin structures having at least two fins.

Figure 2:
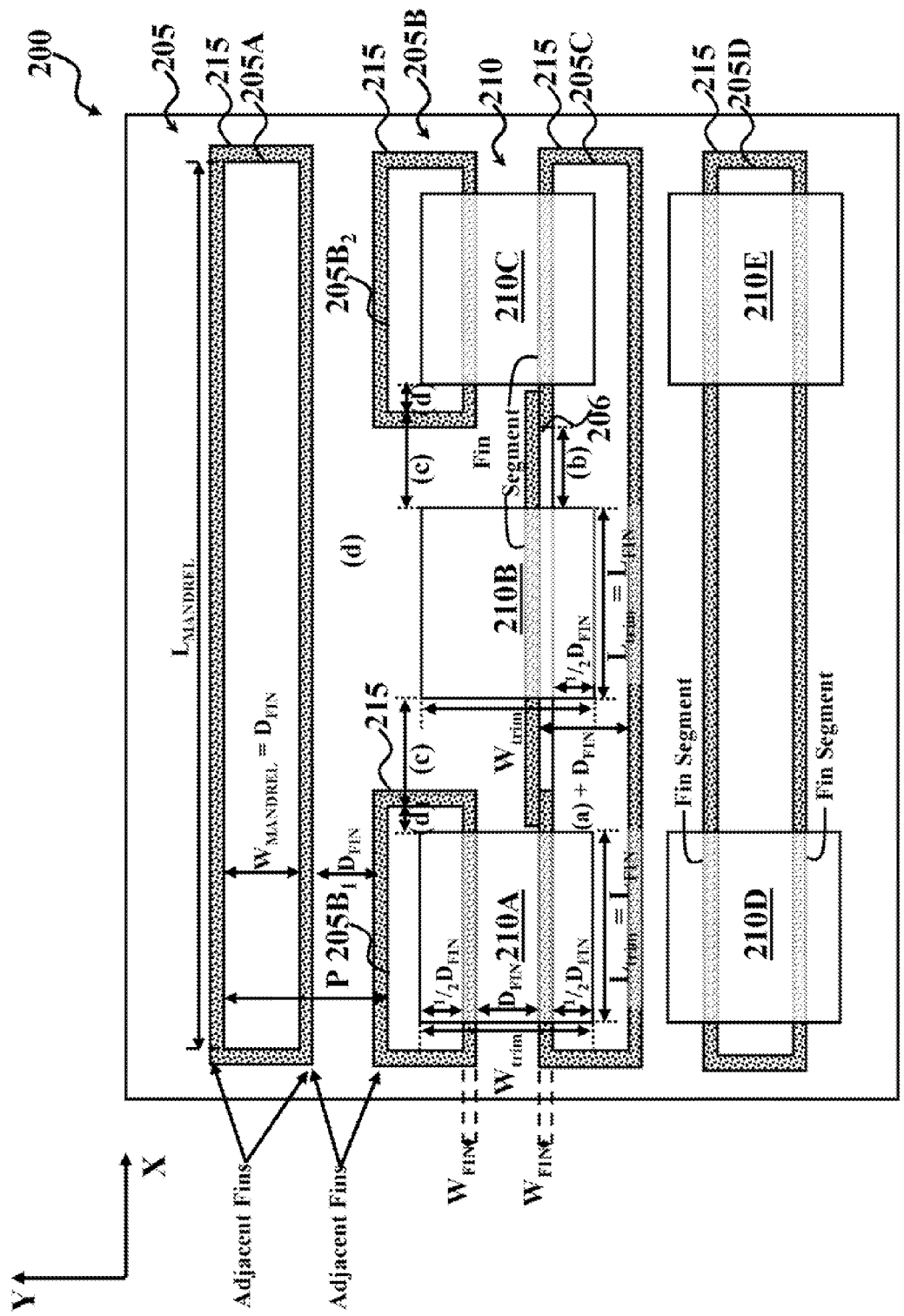
FIG. 2 illustrates an integrated circuit design layout that can be used to fabricate an integrated circuit device that includes a single fin fin-like field effect transistor (FinFET) device according to various aspects of the present disclosure.

The following discussion proposes methods for forming a single fin FinFET device. FIG. 2 illustrates an integrated circuit design layout 200 that can be used to fabricate an integrated circuit device that includes a single fin FinFET device according to various aspects of the present disclosure. In the depicted embodiment, as further discussed below, the integrated circuit design layout 200 includes at least three design layouts associated with the integrated circuit design layout superimposed on one another according to various aspects of the present disclosure. FIG. 2 has been simplified for the sake of clarity to better understand the inventive concepts of the present disclosure. Additional features can be added in the integrated circuit design layout 200, and some of the features described below can be replaced or eliminated in other embodiments of the integrated circuit design layout 200.

The integrated circuit design layout 200 can be expressed in any suitable format, such as in GDS format. The integrated circuit design layout 200 may be in a GDSII file format (or DFII file format). The integrated circuit design layout 200 includes various geometrical patterns designed for an integrated circuit device based on a specification of the integrated circuit device. The integrated circuit design layout 200 is presented in one or more data files having information of the geometrical patterns. For example, in the depicted embodiment, the integrated circuit design layout 200 includes geometrical patterns that define masking (or patterning) features 205, masking (or patterning) features 210, and masking (or patterning) features 215 that are used to form fins of various FinFET devices of an integrated circuit device. The masking features 205 can be included in a main mask layout, the masking features 210 can be included in a trim mask layout, and the masking features 215 can be included in a spacer mask layout. Accordingly, in the depicted embodiment, the integrated circuit design layout 200 includes the main mask layout including the masking features 205 superimposed on the trim mask layout including the masking features 210 and the spacer mask layout including the masking features 215, such that the main mask layout, the trim mask layout, and the spacer mask layout have a spatial relationship (and thus the masking features 205, masking features 210, and masking features 215 have a spatial relationship) that ensures that fins of various FinFET devices of the integrated circuit device are appropriately placed in various FinFET device areas during integrated circuit fabrication.

The masking features 205 include mandrel features 205A, 205B, 205C, and 205D that define mandrels; the masking features 210 include trim mask portions 210A, 210B, 210C, 210D, and 210E that define various FinFET device areas of the integrated circuit device; and the masking features 215 define spacers. Each trim mask portion 210A, 210B, 210C, 210D, and 210E is spatially related to the masking features 205 and the masking features 215, such that each trim mask portion 210A, 210B, 210C, 210D, and 210E overlaps the masking features 205 and the masking features 215 to define a number of fins in each FinFET device area and dimensions of the fins of each FinFET device area. The fins are designated as fin segments in FIG. 2. In the depicted embodiment, each trim mask portion 210A, 210B, 210C, 210D, and 210E has a width ($W_{TRIM}$) and a length ($L_{TRIM}$) that defines the various FinFET device areas of the integrated circuit device. The length ($L_{TRIM}$) of each trim mask portion 210A, 210B, 210C, 210D, and 210E defines a length ($L_{FIN}$) of the fins (fin segments) in each FinFET device area, which is a length of the masking features 215 overlapped by each trim mask portion 210A, 210B, 210C, 210D, and 210E. A width of the masking features 215 defines a width ($W_{FIN}$) of each fin (fin segment); and a distance between adjacent masking features 215 defines a distance ($D_{FIN}$) between adjacent fins (fin segments). Each mandrel feature 205A, 205B, 205C, and 205D has a width ($W_{MANDREL}$) and a length ($L_{MANDREL}$), where the width ($W_{MANDREL}$) of each mandrel feature 205A, 205B, 205C, and 205D also defines the distance ($D_{FIN}$) between adjacent fins (fin segments).

In furtherance of the depicted embodiment, the width ($W_{TRIM}$) of each trim mask portion 210A, 210B, 210C, 210D, and 210E defines at least two fins (fin segments) within its associated FinFET device area. For example, the width ($W_{TRIM}$) of each of the trim mask portions 210A, 210B, 210C, 210D, and 210E is about equal to $2D_{fin}+2W_{fin}$. The trim mask portions 210D and 210E are spatially related to the mandrel feature 205D and its associated masking feature 215, such that the trim mask portion 210D and 210E overlap portions of mandrel feature 205D (specifically overlapping the width ($W_{MANDREL}$)) and the masking feature 215 to define two fins (fin segments) in their associated FinFET device area. The trim mask portions 210A, 210B, and 210C are spatially related to the mandrel features 205B and 205C such that the trim mask portions 210A, 210B, and 210C overlap portions of mandrel feature 205B and mandrel feature 205C and their associated masking features 215. In the depicted embodiment, a portion of the mandrel feature 205B has been removed, such that the trim mask portion 210A overlaps a portion $205B_1$ of the mandrel feature 205B and a portion of the mandrel feature 205C, the trim mask portion 210B overlaps a portion of the mandrel feature 205C, and the trim mask portion 210C overlaps a portion $205B_2$ of the mandrel feature 205B and a portion of the mandrel feature 205C. Accordingly, the trim mask portion 210A overlaps the masking feature 215 associated with the portion $205B_1$ of the mandrel feature 205B and the masking feature 215 associated with the mandrel feature 205C; the trim mask portion 210B overlaps the masking feature 215 associated with the mandrel feature 205C; and the trim mask portions 210C overlaps the masking feature 215 associated with portion $205B_2$ of the mandrel feature 205B and the masking feature 215 associated with the mandrel feature 205C. The trim mask portions 210A and 210C thus define two fins (fin segments) in their associated FinFET device area. Since the portion of the mandrel feature 205B that the trim mask portion 210B would have overlapped has been removed, the trim mask portion 210B defines a single fin (fin segment) for its associated FinFET device area. To facilitate critical dimension (CD) control and ensure sufficient spacing between the trim mask portion 210B and its associated fin segment, a supplementary mandrel feature 206 having a width (a) may be added to the mandrel 205C. In the present example, the supplementary mandrel feature 206 has a length that is greater than the length ($L_{TRIM}$) of the trim mask portion 210B, or the length ($L_{FIN}$) of the fin (fin segment). Further, a length (b) of the supplementary mandrel feature 206 on either side of the trim mask portion 210B is sufficient to prevent corner rounding during fabrication; a distance (c) between the trim mask portion 210B and respective portions $205B_1$ and $205B_2$ of the mandrel feature 205B is sufficient to prevent a portion of the masking features 215 associated with respective portions $205B_1$ and $205B_2$ of the mandrel feature 205B from remaining during integrated circuit fabrication; and a distance (d) between an end of portions $205B_1$ and $205B_2$ of the mandrel feature 205B and respective trim mask portion 210A and trim mask portion 210C is sufficient to prevent line-end rounding and shortening that may occur during integrated circuit fabrication.

The integrated circuit design layout 200 is used to fabricate masks that are used to form masking (or patterning) features used to form the integrated circuit device. In the depicted embodiment, the integrated circuit design layout 200 is used to form a main mask based on the main mask layout that includes the masking features 205, a trim mask based on the trim mask layout that includes the masking features 210, and a spacer mask based on the spacer layout that includes the masking features 215. The masks can be formed in various technologies. For example, the masks may be formed using a binary technology. The binary mask includes a transparent substrate (for example, fused quartz) and an opaque material (for example, chromium) coated in the opaque regions of the mask. In another example, the masks are formed using a phase shift technology, where various features in the pattern formed on the masks are configured to have proper phase difference to enhance the resolution and imaging quality. In various examples, the phase shift mask (PSM) can be an attenuated PSM or alternating PSM.

FIGS. 3A-3G are top views of an integrated circuit device 300 during various stages of fabrication using the integrated circuit design layout 200 of FIG. 2 according to various aspects of the present disclosure. The integrated circuit device 300 is an integrated circuit (IC) chip, system on chip (SoC), or portion thereof, that includes various passive and active microelectronic components, such as resistors, capacitors, inductors, diodes, metal-oxide-semiconductor field effect transistors (MOSFETs), complementary MOS (CMOS) transistors, bipolar junction transistors (BJTs), laterally diffused MOS (LDMOS) transistors, high power MOS transistors, fin-like field effect transistors (FinFETs), other suitable components, or combinations thereof. In the depicted embodiment, as further discussed below, the integrated circuit device 300 includes various FinFET devices, and the integrated circuit device 300 is illustrated during various stages of FinFET device fabrication. The term FinFET device refers to any fin-based, multi-gate transistor. FIGS. 3A-3G have been simplified for the sake of clarity to better understand the inventive concepts of the present disclosure. Additional features can be added in the integrated circuit device 300, and some of the features described below can be replaced or eliminated in other embodiments of the integrated circuit device 300.

Figure 3A:
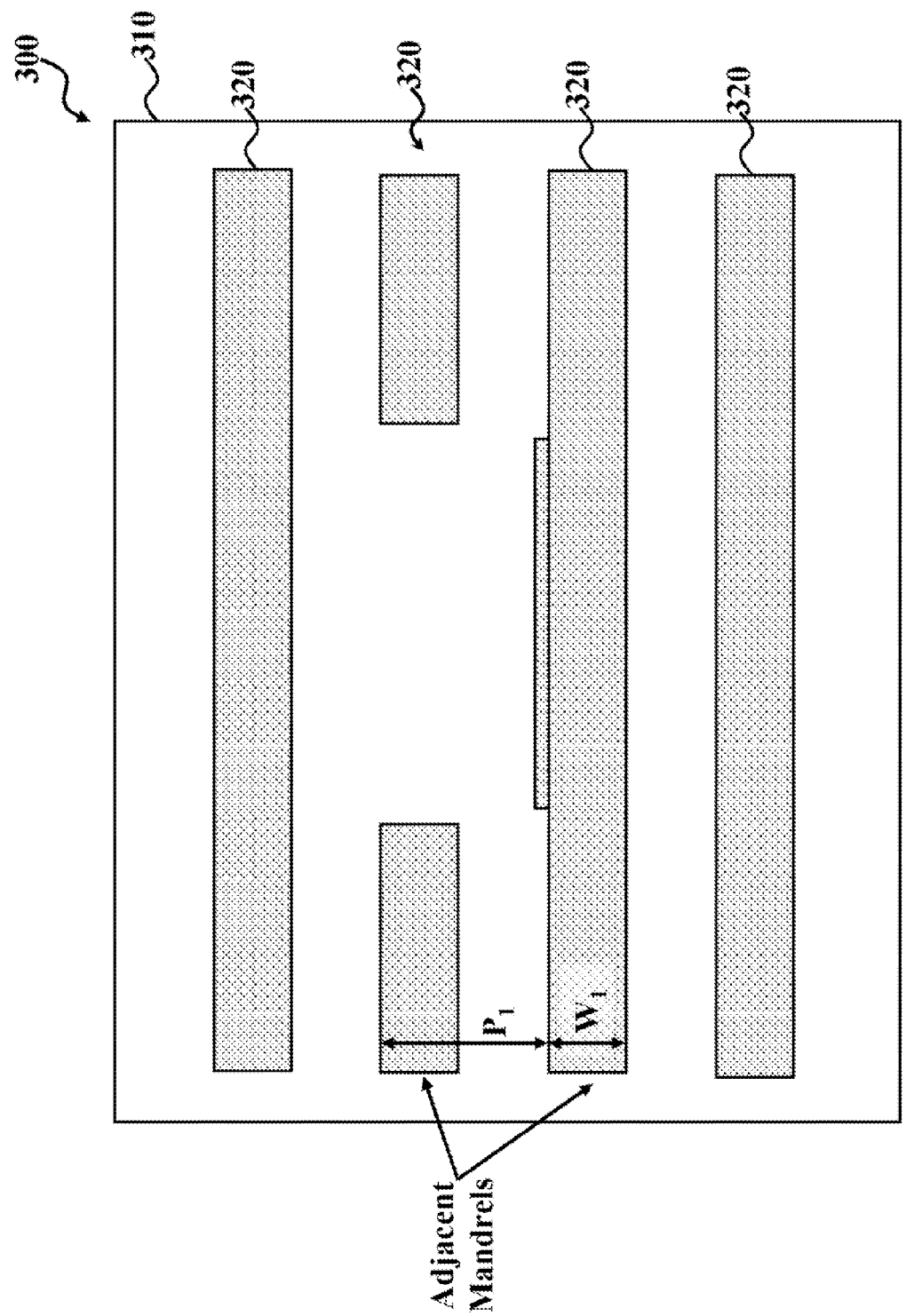
FIGS. 3A-3G are top views of an integrated circuit device during various stages of fabrication using the integrated circuit design layout of FIG. 2 according to various aspects of the present disclosure.
Figure 3B:
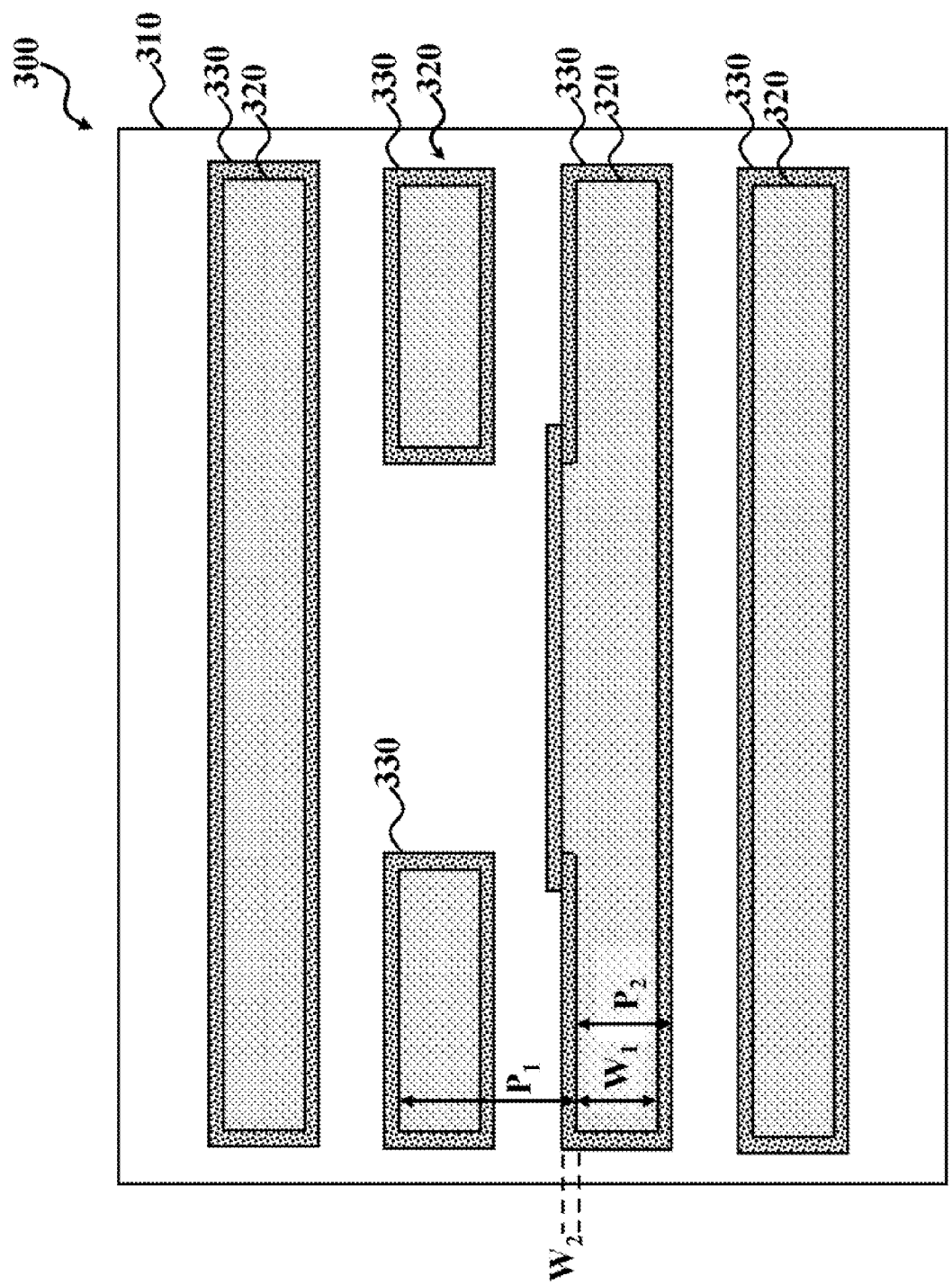
Figure 3C:
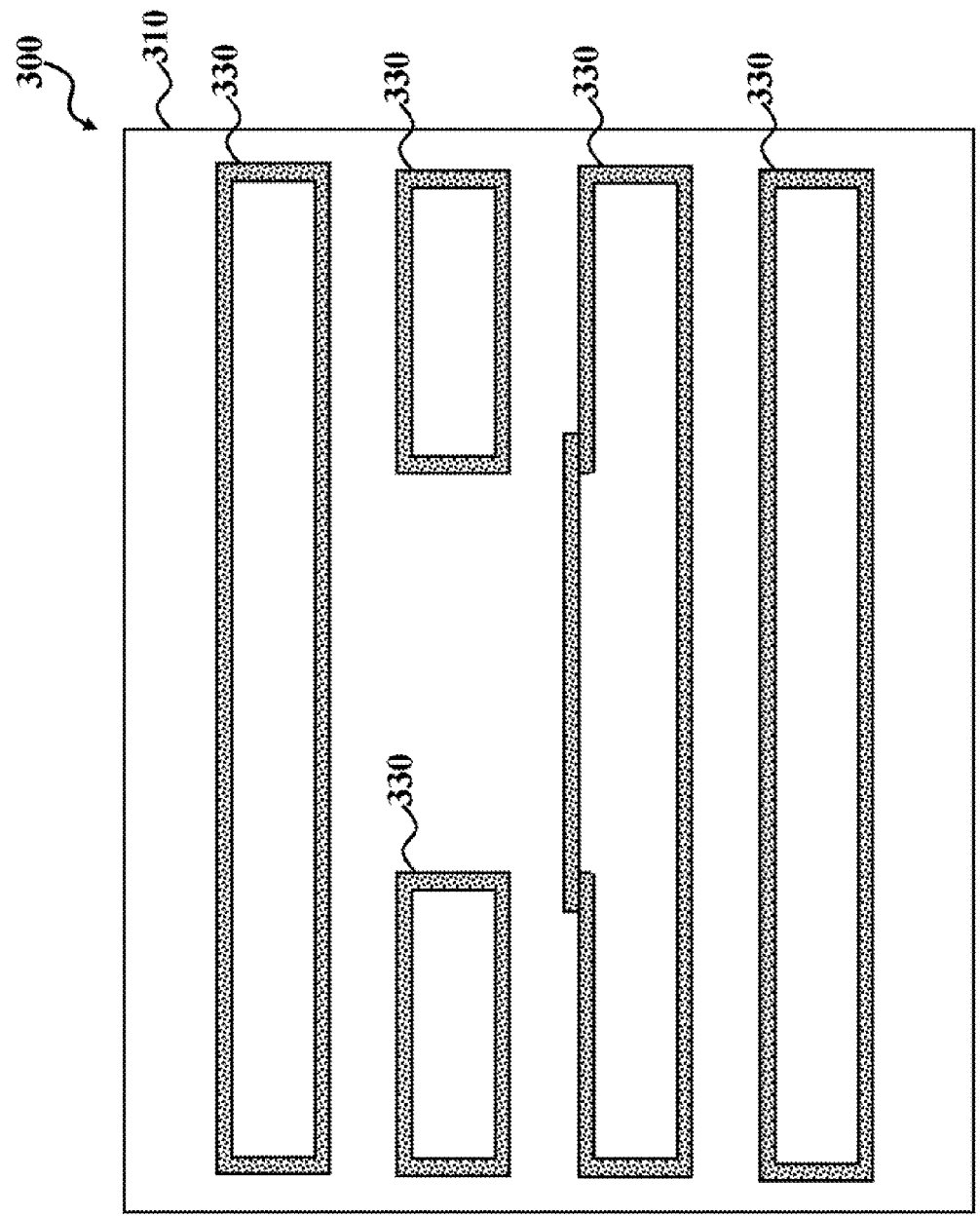

In FIGS. 3A-3C, a first or main masking process is performed to define a width and a pitch of fins of various fin structures of the integrated circuit device 300, where the fin structures are included in various FinFET devices. In FIG. 3A, a substrate 310 is provided. In the present example, the substrate 310 is a semiconductor substrate including silicon. Alternatively or additionally, the substrate 310 includes an elementary semiconductor, such as germanium; a compound semiconductor, such as silicon carbide, gallium arsenide, gallium phosphide, indium phosphide, indium arsenide, and/or indium antimonide; or combinations thereof. Alternatively, the substrate 310 is a silicon-on-insulator (SOI) substrate, which can be fabricated using separation by implantation of oxygen (SIMOX), wafer bonding, or other methods. The substrate 310 may include various doped regions and other suitable features.

An array of mandrels 320 are disposed over the substrate 310, where adjacent mandrels 320 are spaced from one another by a pitch, $P_1$, and each mandrel 320 has a width, $W_1$. The mandrels 320 include a patterning or masking material, such as a resist material, polysilicon, silicon oxide, silicon nitride, other patterning or masking material, or combinations thereof. In an example, forming the mandrels 320 includes depositing a patterning or masking layer (such as a polysilicon layer) over the substrate 310; forming a resist layer over the masking layer; using a mandrel mask (which may be referred to as a main mask) to expose the resist layer to radiation, thereby forming exposed portions of the resist layer and unexposed portions of the resist layer; removing the exposed portions or unexposed portions of the resist layer (for example, by subjecting the exposed resist layer to a developing solution), thereby forming a patterned resist layer that exposes portions of the masking layer; and using the patterned resist layer to etch the masking layer, specifically, the exposed portions of the masking layer, to form the mandrels 320 as illustrated in FIG. 3A. In the depicted embodiment, the main mask used to form the mandrels 320 is fabricated based on the main mask layout (which includes the masking features 205) associated with the integrated circuit design layout 200 of FIG. 2. In other examples, the mandrels 320 are formed by various deposition processes, lithography processes, etching processes, or combinations thereof, such as the processes described herein.

In FIG. 3B, spacers 330 are formed over the substrate 310, such that each of the mandrels 320 is surrounded by a spacer 330; and in FIG. 3C, the mandrels 320 are removed, for example, by an etching process, such that the spacers 330 remain disposed over the substrate 310. The spacers 330 include a patterning or masking material, such as a resist material, polysilicon, silicon oxide, silicon nitride, other patterning or masking material, or combinations thereof. In the depicted embodiment, the spacers 330 include silicon nitride. The spacers 330 are formed by various deposition processes, lithography processes, etching processes, or combinations thereof, such as the processes described herein. The spacers 330 on opposite sidewalls of each mandrel 320 have a width, $W_2$, that is less than the width, $W_1$, of each mandrel 320. The spacers on opposite sidewalls of each mandrel 320 are also spaced from one another by a pitch, $P_2$, that is less than the pitch, $P_1$, of the mandrels 320. As further described below, the spacers 330 are used to form the fin structures of the integrated circuit device 300, such that the pitch, $P_2$, and the width, $W_2$, of the spacers 330 define the width and the pitch of various fin structures of the integrated circuit device 300.

Figure 3D:
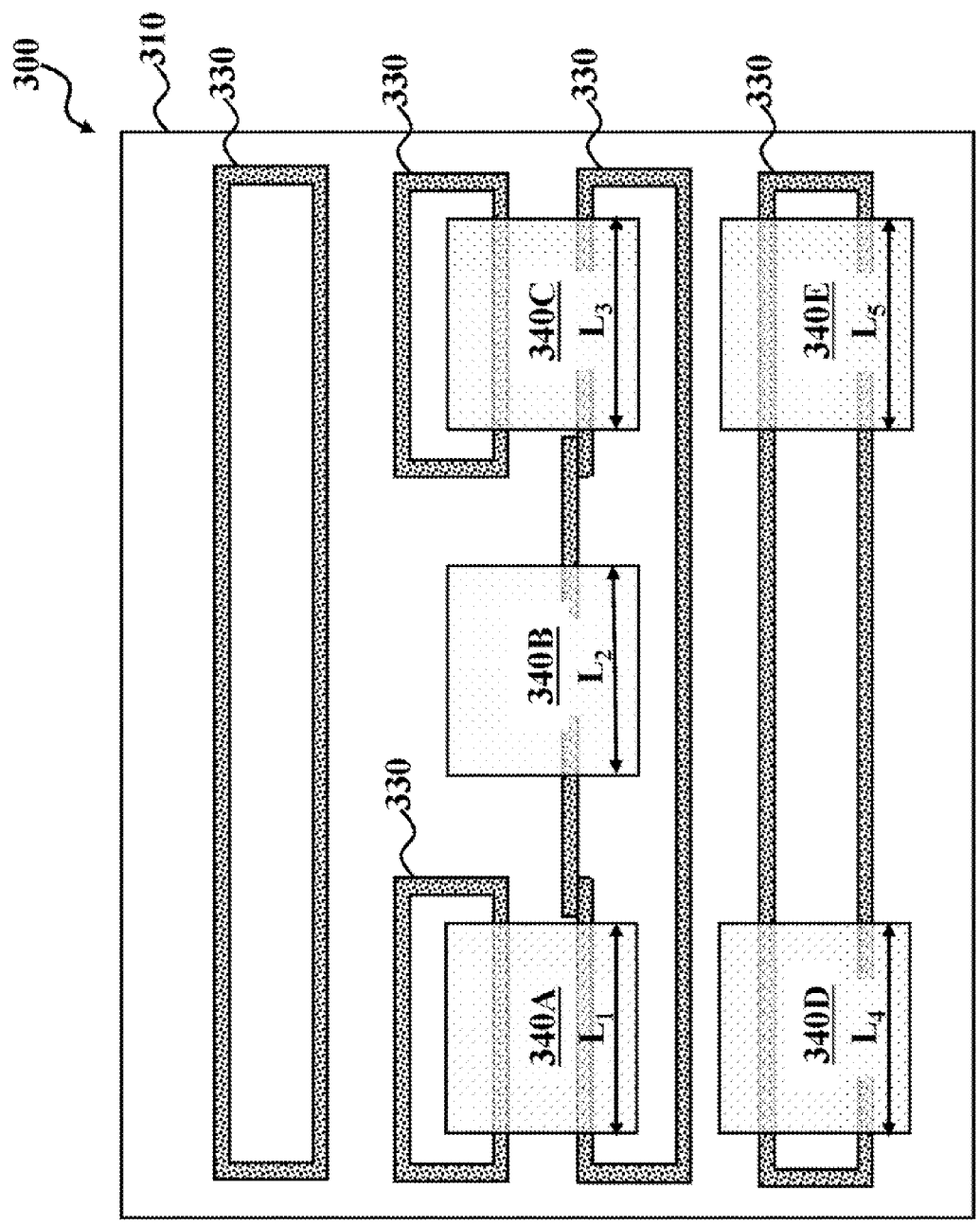

In FIGS. 3D-3G, a second or trim (or cut) masking process is performed to define lengths of the fins of the various fin structures of the integrated circuit device 300. In FIG. 3D, a trim masking layer that includes array of trim mask portions 340A, 340B, 340C, 340D, and 340E is disposed over the substrate 310. Each trim mask portion 340A, 340B, 340C, 340D, and 340E defines a FinFET device area of the integrated circuit device 300. More specifically, in the depicted embodiment, each trim mask portion 340A, 340B, 340C, 340D, and 340E defines a number of fins that a fin structure of a FinFET device of the integrated circuit device 300 will include and a length of the fins of the fin structure of the respective FinFET device (such as length, $L_1$; length, $L_2$; length, $L_3$; length, $L_4$; and length, $L_5$). The trim masking layer 340 includes a patterning or masking material, such as a resist material, polysilicon, silicon oxide, silicon nitride, other patterning or masking material, or combinations thereof. In the depicted embodiment, the trim masking layer 340 includes a resist material. In an example, forming the trim masking layer 340 includes depositing a resist layer over the substrate 310; using a trim mask (which may be referred to as an active region mask) to expose the resist layer to radiation, thereby forming exposed portions of the resist layer and unexposed portions of the resist layer; removing the exposed portions or unexposed portions of the resist layer (for example, by subjecting the exposed resist layer to a developing solution), thereby forming a patterned resist layer, specifically the trim masking layer 340 as illustrated in FIG. 3D that provides unexposed portions of the spacers 330 and exposed portions of the spacers 330. In the depicted embodiment, the trim mask used to form the trim masking layer 340 is fabricated based on the trim mask layout (which includes the masking features 210) associated with the integrated circuit design layout 200 of FIG. 2. The trim masking layer 340 includes the trim mask portions 340A, 340B, 340C, 340D, and 340E that covers portions of the spacers 330, thereby providing the unexposed portions of the spacers 330. In other examples, the trim masking layer 340 is formed by various deposition processes, lithography processes, etching processes, or combinations thereof, such as the processes described herein.

Figure 3E:
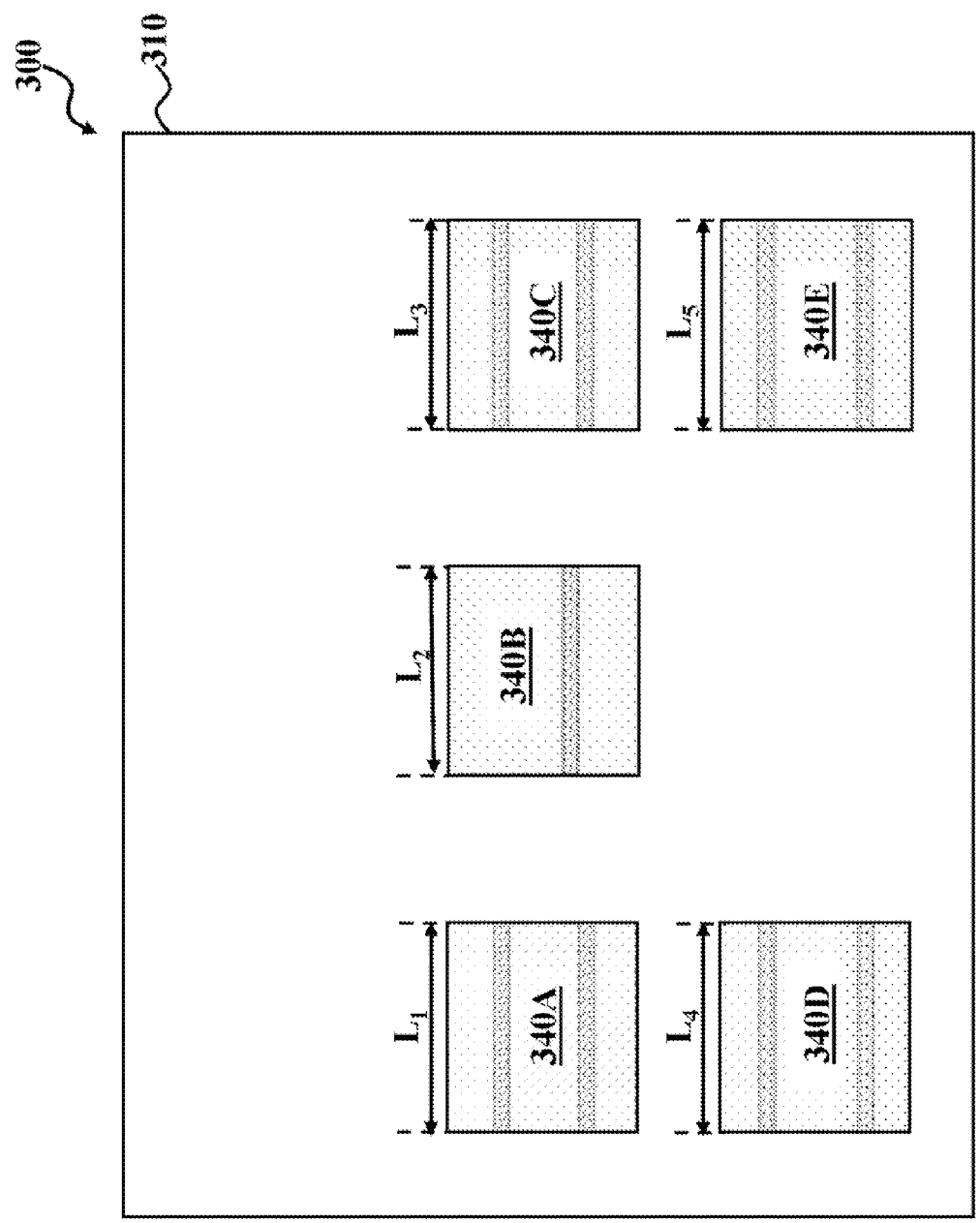
Figure 3F:
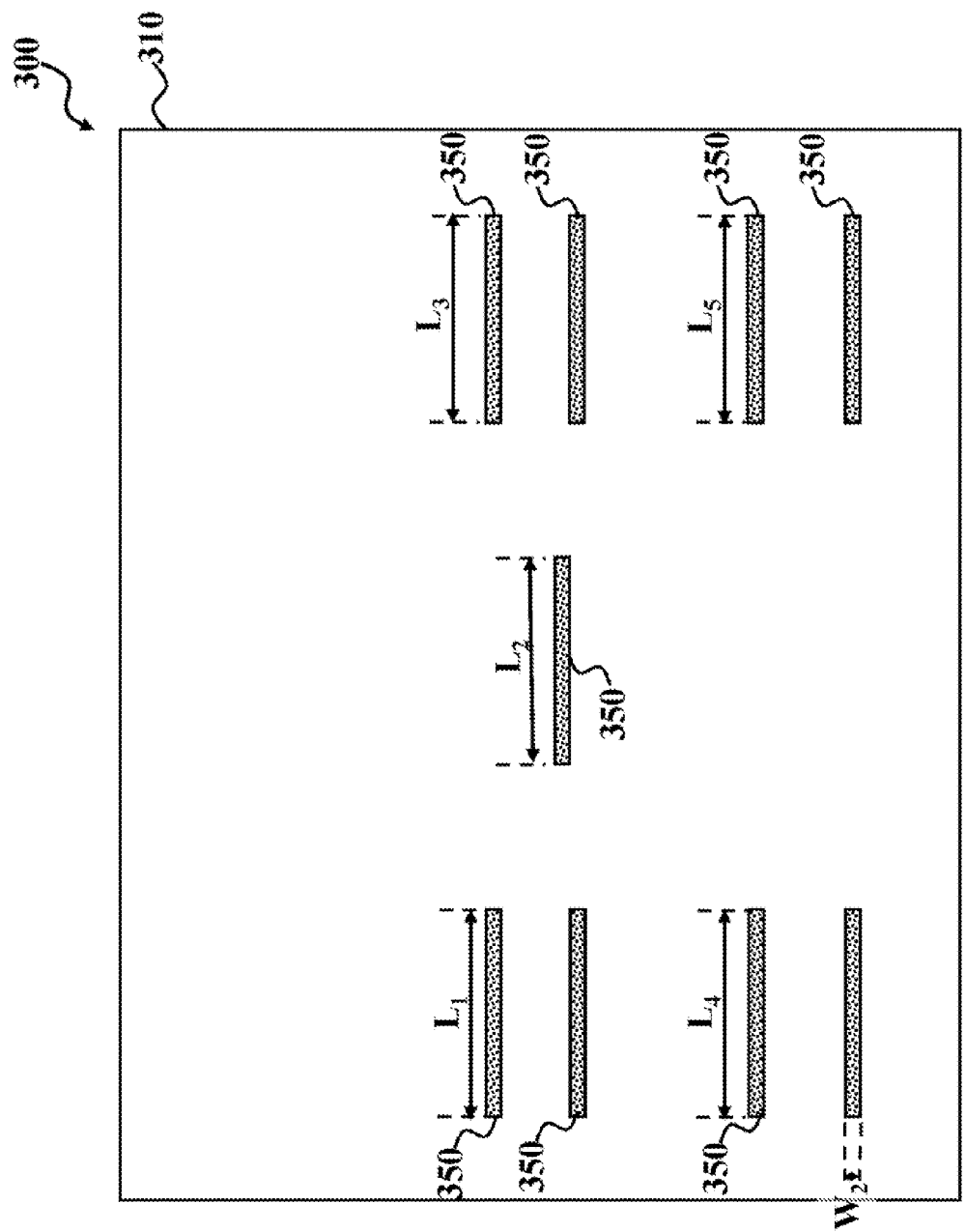
Figure 3G:
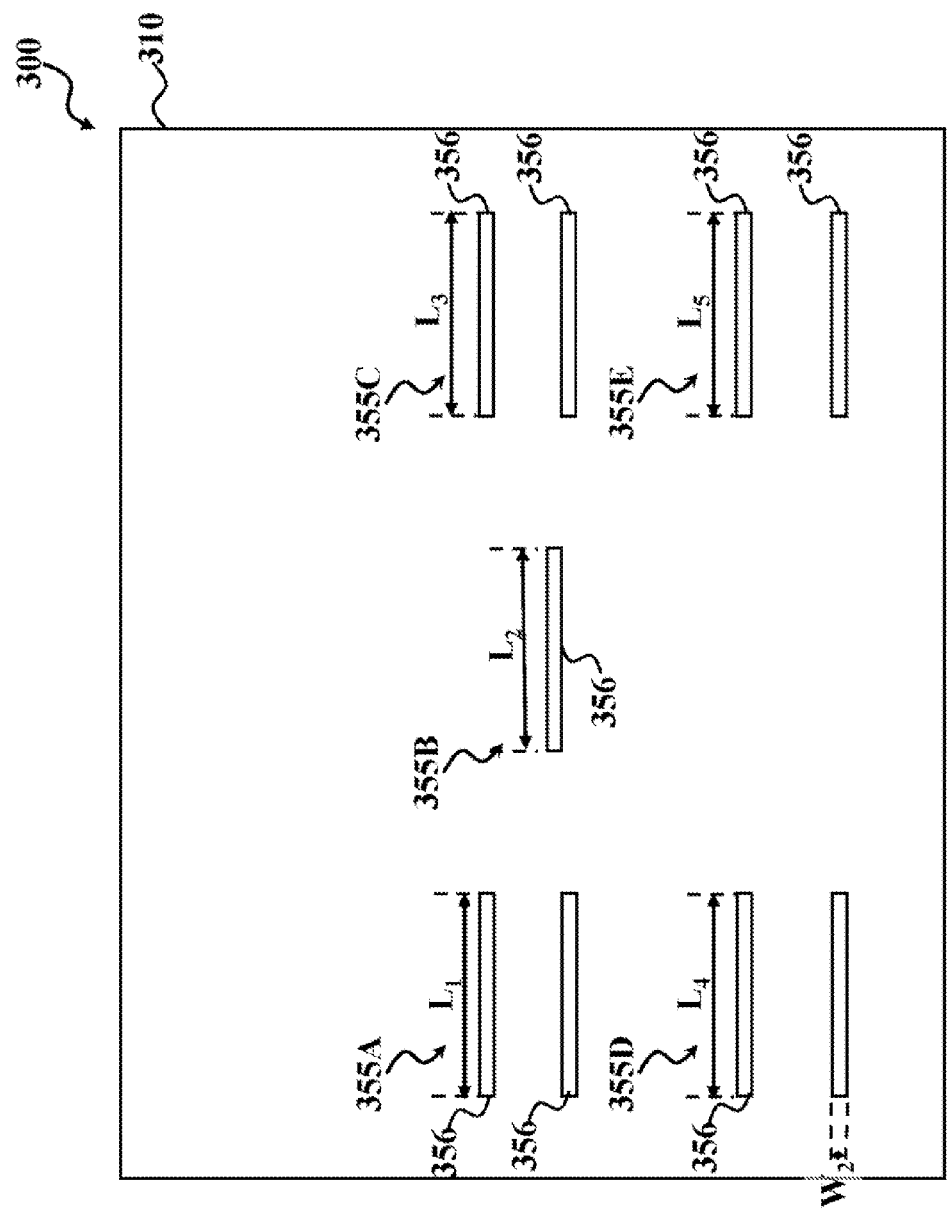

In FIG. 3E, the exposed portions of the spacers 330 are removed, for example, by an etching process; and in FIG. 3F, the trim masking layer 340 is removed, leaving spacer segments 350 disposed over the substrate 310. Each spacer segment 350 has the width, $W_2$; adjacent spacer segments 350 are spaced by the pitch, $P_2$; and each spacer segment 350 has the length, $L_1$, length, $L_2$, length, $L_3$, length, $L_4$, or length, $L_5$. The spacer segments 350 leave exposed portions of the substrate 310 and unexposed portions of the substrate 310. In FIG. 3G, the spacer segments 350 are used as a mask to remove the exposed portions of the substrate 310 (for example, by an etching process), thereby forming FinFET device areas 355A, 355B, 355C, 355D, and 355E. Each FinFET device area 355A, 355B, 355C, 355D, and 355E includes a fin structure having fins 356 that extend from the substrate 310. In the depicted embodiment, the FinFET device area 355A includes a fin structure having two fins 356 having the length, $L_1$; the FinFET device area 355B includes a fin structure having one fin 356 having the length, $L_2$; the FinFET device area 355C includes a fin structure having two fins 356 having the length, $L_3$; the FinFET device area 355D includes a fin structure having two fins 356 having the length, $L_4$; and the FinFET device area 355E includes a fin structure having two fins 356 having the length, $L_5$. The integrated circuit device 300 thus includes a FinFET device in the FinFET device area 355B that includes a fin structure with one fin 356 (which may be referred to as a single fin FinFET device). The single fin FinFET device is achieved by modifying the mandrels, such that the trim mask portion that typically defines two fins instead defines a single fin. Subsequent processing can be performed to complete fabrication of the integrated circuit device 300, such as that described above (for example, various gate structures, epitaxial features, conductive features, and other features may be formed).

Figure 4:
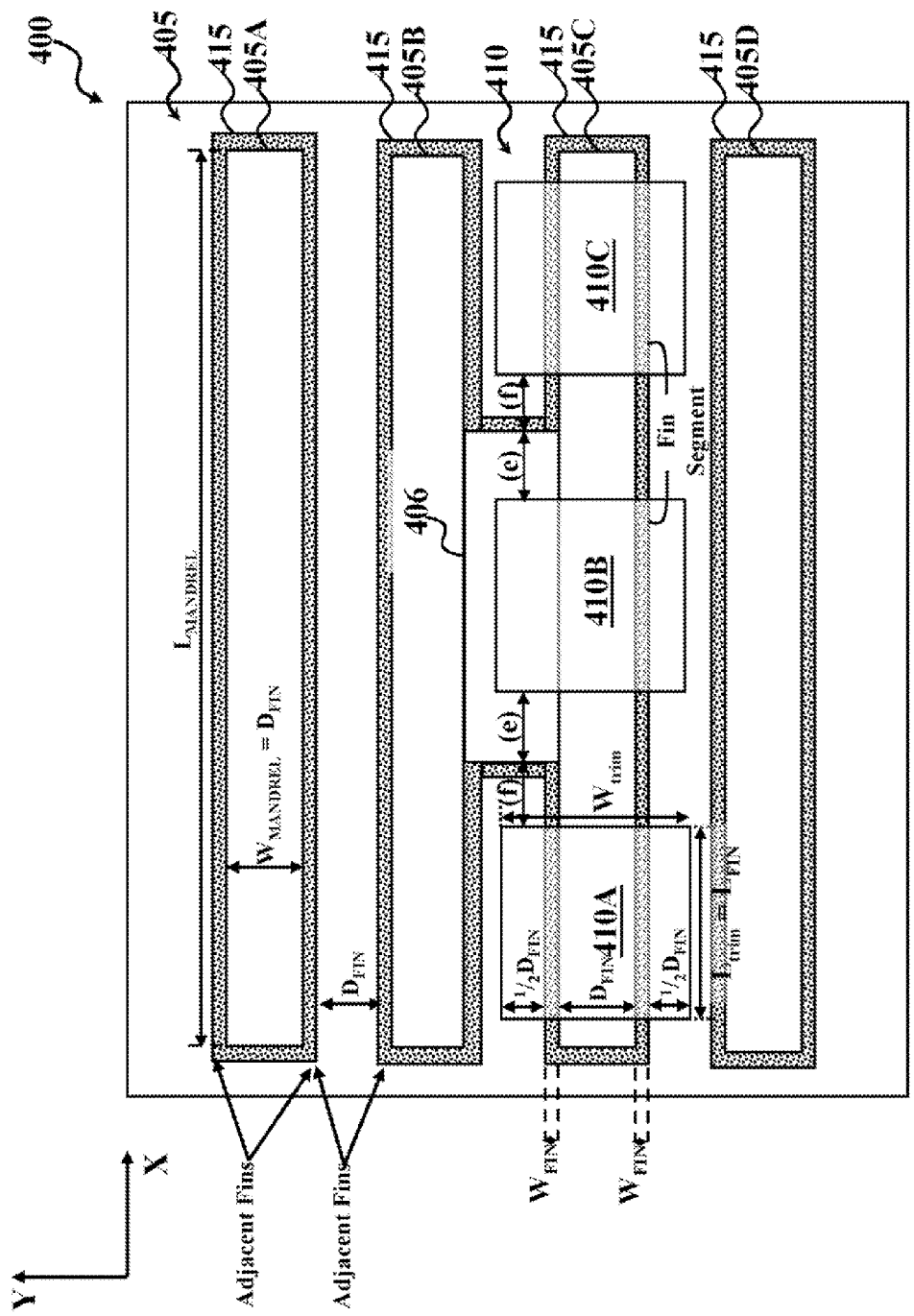
FIG. 4 illustrates another integrated circuit design layout that can be used to fabricate an integrated circuit device that includes a single fin FinFET device according to various aspects of the present disclosure.

FIG. 4 illustrates an integrated circuit design layout 400 that can be used to fabricate an integrated circuit device that includes a single fin FinFET device according to various aspects of the present disclosure. In the depicted embodiment, as further discussed below, the integrated circuit design layout 400 includes at least three design layouts associated with the integrated circuit design layout superimposed on one another according to various aspects of the present disclosure. FIG. 4 has been simplified for the sake of clarity to better understand the inventive concepts of the present disclosure. Additional features can be added in the integrated circuit design layout 400, and some of the features described below can be replaced or eliminated in other embodiments of the integrated circuit design layout 400.

The integrated circuit design layout 400 can be expressed in any suitable format, such as in GDS format. The integrated circuit design layout 400 may be in a GDSII file format (or DFII file format). The integrated circuit design layout 400 includes various geometrical patterns designed for an integrated circuit device based on a specification of the integrated circuit device. The integrated circuit design layout 400 is presented in one or more data files having information of the geometrical patterns. For example, in the depicted embodiment, the integrated circuit design layout 400 includes geometrical patterns that define masking (or patterning) features 405, masking (or patterning) features 410, and masking (or patterning) features 410 that are used to form fins of various FinFET devices of an integrated circuit device. The masking features 405 can be included in a main mask layout, the masking features 415 can be included in a trim mask layout, and the masking features 415 can be included in a spacer mask layout. Accordingly, in the depicted embodiment, the integrated circuit design layout 400 includes the main mask layout including the masking features 405 superimposed on the trim mask layout including the masking features 410 and the spacer mask layout including the masking features 415, such that the main mask layout, the trim mask layout, and the spacer mask layout have a spatial relationship (and thus the masking features 405, masking features 410, and masking features 415 have a spatial relationship) that ensures that fins of various FinFET devices of the integrated circuit device are appropriately placed in various FinFET device areas during integrated circuit fabrication.

The masking features 405 include mandrel features 405A, 405B, 405C, and 405D that define mandrels; the masking features 410 include trim mask portions 410A, 410B, and 410C that define various FinFET device areas of the integrated circuit device; and the masking features 415 define spacers. Each trim mask portion 410A, 410B, and 410C is spatially related to the masking features 405 and the masking features 415, such that each trim mask portion 410A, 410B, and 410C overlaps the masking features 405 and the masking features 415 to define a number of fins in each FinFET device area and dimensions of the fins of each FinFET device area. The fins are designated as fin segments in FIG. 4. In the depicted embodiment, each trim mask portion 410A, 410B, and 410C has a width ($W_{TRIM}$) and a length ($L_{TRIM}$) that defines the various FinFET device areas of the integrated circuit device. The length ($L_{TRIM}$) of each trim mask portion 410A, 410B, and 410C defines a length ($L_{FIN}$) of the fins (fin segments) in each FinFET device area, which is a length of the masking features 415 overlapped by each trim mask portion 410A, 410B, and 410C. A width of the masking features 415 defines a width ($W_{FIN}$) of each fin (fin segment); and a distance between adjacent masking features 415 defines a distance ($D_{FIN}$) between adjacent fins (fin segments). Each mandrel feature 405A, 405B, 405C, and 405D has a width ($W_{MANDREL}$) and a length ($L_{MANDREL}$), where the width ($W_{MANDREL}$) of each mandrel feature 405A, 405B, 405C, and 405D also defines the distance ($D_{FIN}$) between adjacent fins (fin segments). In furtherance of the depicted embodiment, the width ($W_{TRIM}$) of each trim mask portion 410A, 410B, and 410C defines at least two fins (fin segments) within its associated FinFET device area. For example, the width ($W_{TRIM}$) of each of the trim mask portions 410A, 410B, and 410C is about equal to $2D_{fin}+2W_{fin}$. The trim mask portions 410A, 410B, and 410C are spatially related to the mandrel feature 405C and its associated masking feature 415, such that the trim mask portions 410A, 410B, and 410C overlap portions of mandrel feature 405C (specifically overlapping the width ($W_{MANDREL}$)) and the masking feature 415 to define two fins (fin segments) in their associated FinFET device area. In the depicted embodiment, a portion of the mandrel feature 405B has been merged with the mandrel feature 405C via merged mandrel feature portion 406, such that the trim mask portion 410B overlaps the mandrel feature 405C and part of the merged mandrel feature portion 406. In the present example, the merged feature portion 406 has a length that is greater than the length ($L_{TRIM}$) of the trim mask portion 410B, or the length ($L_{FIN}$) of the fin (fin segment), and a width that is equal to about $D_{fin}+2W_{fin}$. Since the mandrel feature 405B has been merged with the mandrel feature 405C via merged mandrel feature portion 406, the trim mask portion 410B defines a single fin (fin segment) for its associated FinFET device area. A distance (e) between the trim mask portion 410B and an end of the merged mandrel feature portion 406 and a distance (f) of the mandrel feature 405B and respective trim mask portions 410A and 410C is sufficient to prevent corner rounding during integrated circuit fabrication.

The integrated circuit design layout 400 is used to fabricate masks that are used to form masking (or patterning) features used to form the integrated circuit device. In the depicted embodiment, the integrated circuit design layout 400 is used to form a main mask based on the main mask layout that includes the masking features 405, a trim mask based on the trim mask layout that includes the masking features 410, and a spacer mask based on the spacer layout that includes the masking features 415. The masks can be formed in various technologies. For example, the masks may be formed using a binary technology. The binary mask includes a transparent substrate (for example, fused quartz) and an opaque material (for example, chromium) coated in the opaque regions of the mask. In another example, the masks are formed using a phase shift technology, where various features in the pattern formed on the masks are configured to have proper phase difference to enhance the resolution and imaging quality. In various examples, the phase shift mask can be an attenuated PSM or alternating PSM.

FIGS. 5A-5G are top views of an integrated circuit device 500 during various stages of fabrication using the integrated circuit design layout 400 of FIG. 4 according to various aspects of the present disclosure. The integrated circuit device 500 is an integrated circuit (IC) chip, system on chip (SoC), or portion thereof, that includes various passive and active microelectronic components, such as resistors, capacitors, inductors, diodes, metal-oxide-semiconductor field effect transistors (MOSFETs), complementary MOS (CMOS) transistors, bipolar junction transistors (BJTs), laterally diffused MOS (LDMOS) transistors, high power MOS transistors, fin-like field effect transistors (FinFETs), other suitable components, or combinations thereof. In the depicted embodiment, as further discussed below, the integrated circuit device 500 includes various FinFET devices, and the integrated circuit device 500 is illustrated during various stages of FinFET device fabrication. The term FinFET device refers to any fin-based, multi-gate transistor. FIGS. 5A-5G have been simplified for the sake of clarity to better understand the inventive concepts of the present disclosure. Additional features can be added in the integrated circuit device 500, and some of the features described below can be replaced or eliminated in other embodiments of the integrated circuit device 500.

Figure 5A:
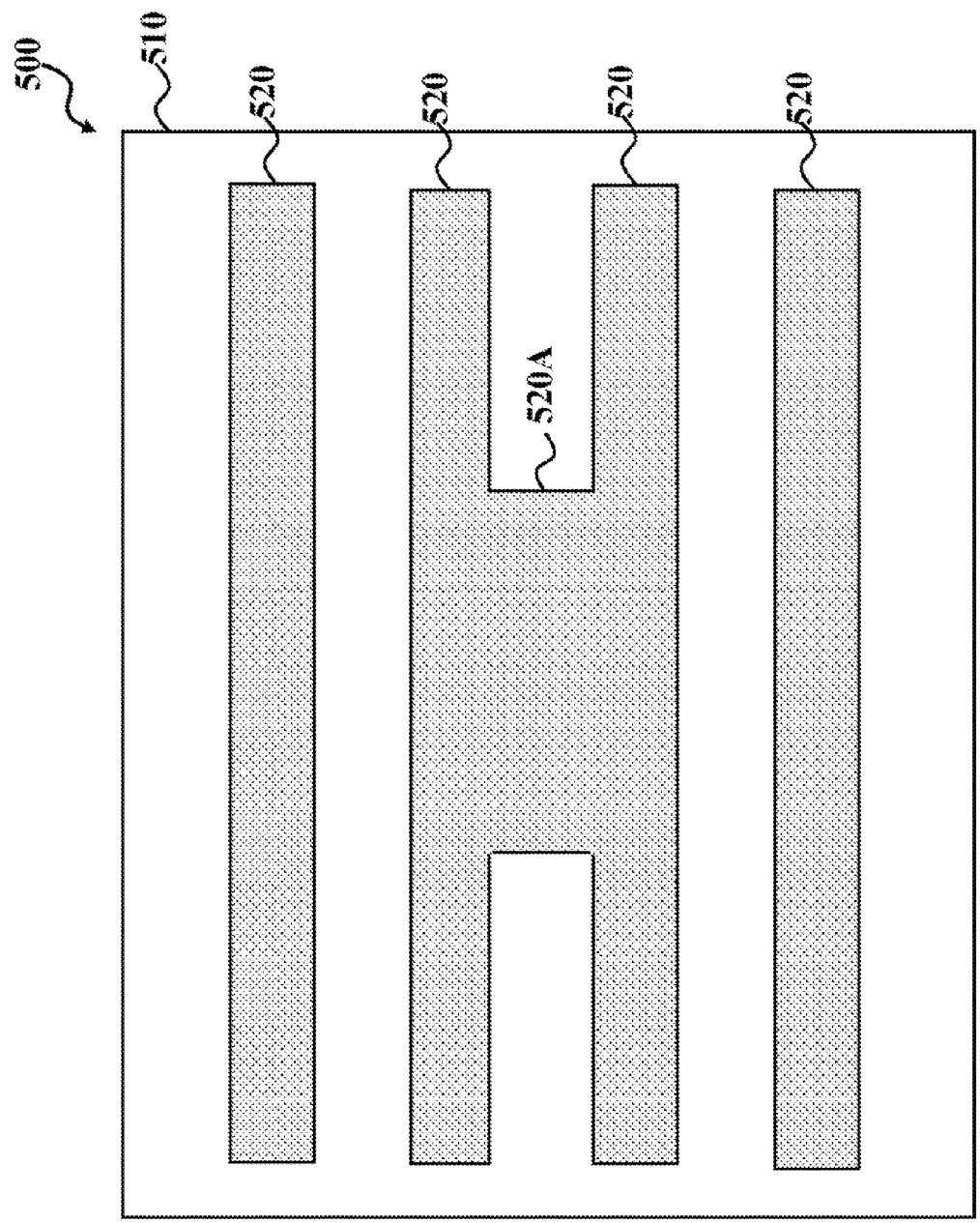
Figure 5B:
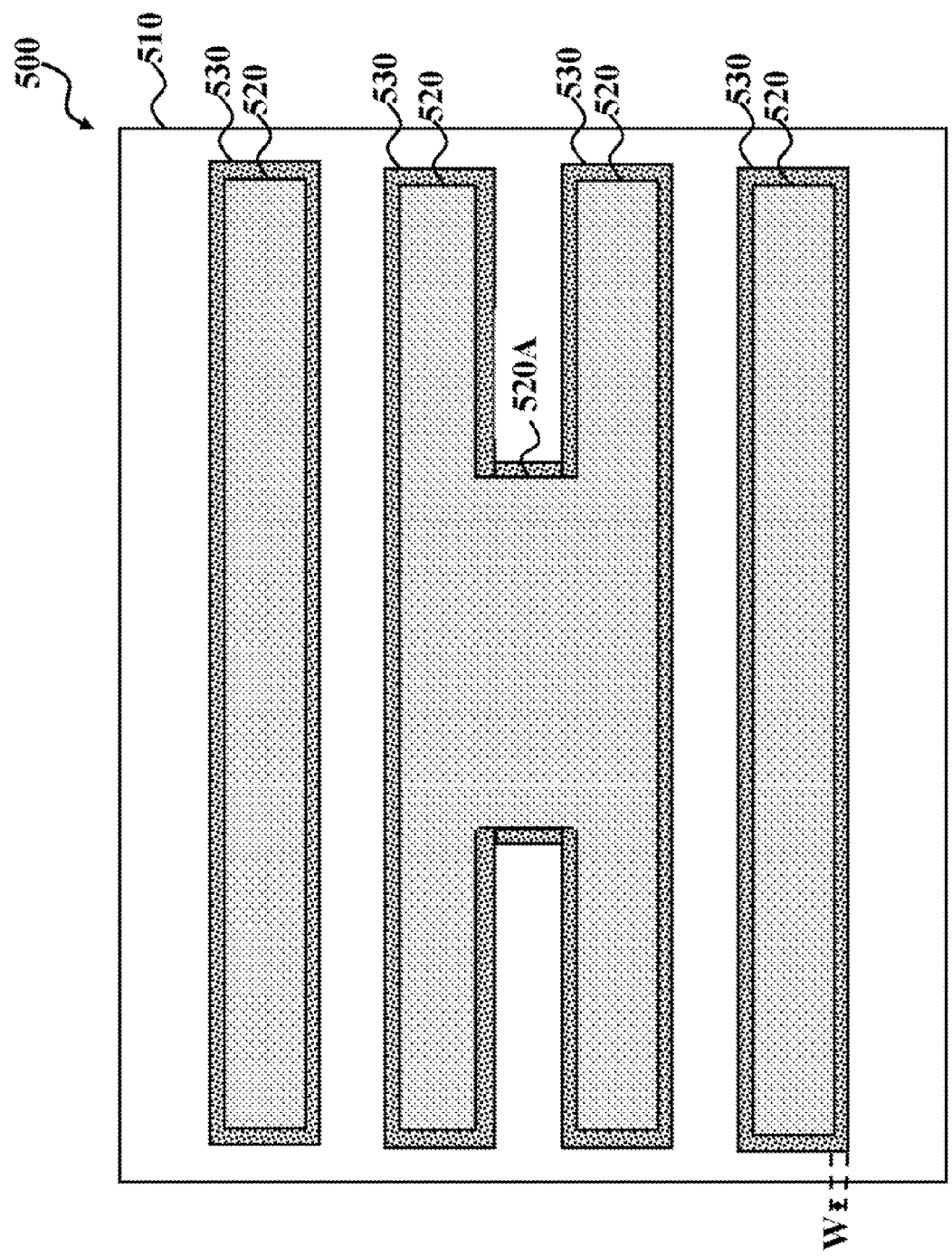
Figure 5C:
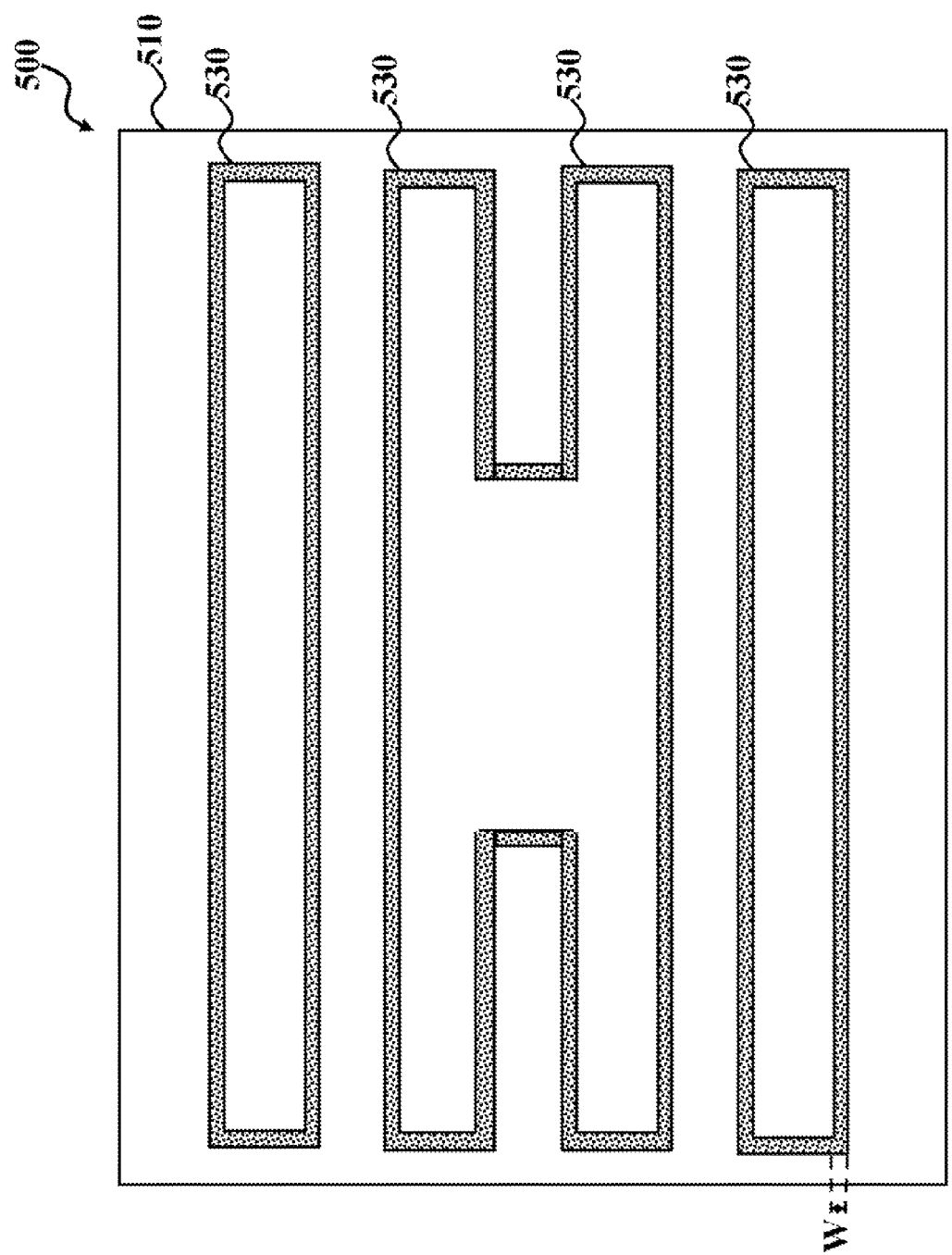

In FIGS. 5A-5C, a first or main masking process is performed to define a width and a pitch of fins of various fin structures of the integrated circuit device 500, where the fin structures are included in various FinFET devices. In FIG. 5A, a substrate 510 is provided. In the present example, the substrate 510 is a semiconductor substrate including silicon. Alternatively or additionally, the substrate 510 includes an elementary semiconductor, such as germanium; a compound semiconductor, such as silicon carbide, gallium arsenide, gallium phosphide, indium phosphide, indium arsenide, and/or indium antimonide; or combinations thereof. Alternatively, the substrate 510 is a silicon-on-insulator (SOI) substrate, which can be fabricated using separation by implantation of oxygen (SIMOX), wafer bonding, or other methods. The substrate 510 may include various doped regions and other suitable features.

An array of mandrels 520 are disposed over the substrate 510, where adjacent mandrels 520 are spaced from one another by a pitch, $P_1$, and each mandrel 520 has a width, $W_1$. The mandrels 520 include a patterning or masking material, such as a resist material, polysilicon, silicon oxide, silicon nitride, other patterning or masking material, or combinations thereof. In an example, forming the mandrels 520 includes depositing a patterning or masking layer (such as a polysilicon layer) over the substrate 510; forming a resist layer over the masking layer; using a mandrel mask (which may be referred to as a main mask) to expose the resist layer to radiation, thereby forming exposed portions of the resist layer and unexposed portions of the resist layer; removing the exposed portions or unexposed portions of the resist layer (for example, by subjecting the exposed resist layer to a developing solution), thereby forming a patterned resist layer that exposes portions of the masking layer; and using the patterned resist layer to etch the masking layer, specifically, the exposed portions of the masking layer, to form the mandrels 520 as illustrated in FIG. 5A. In the depicted embodiment, the main mask used to form the mandrels 520 is fabricated based on the main mask layout (which includes the masking features 405) associated with the integrated circuit design layout 400 of FIG. 4. In other examples, the mandrels 520 are formed by various deposition processes, lithography processes, etching processes, or combinations thereof, such as the processes described herein.

In FIG. 5B, spacers 530 are formed over the substrate 510, such that each of the mandrels 520 is surrounded by a spacer 530; and in FIG. 5C, the mandrels 520 are removed, for example, by an etching process, such that the spacers 530 remain disposed over the substrate 510. The spacers 530 include a patterning or masking material, such as a resist material, polysilicon, silicon oxide, silicon nitride, other patterning or masking material, or combinations thereof. In the depicted embodiment, the spacers 530 include silicon nitride. The spacers 530 are formed by various deposition processes, lithography processes, etching processes, or combinations thereof, such as the processes described herein. The spacers 530 on opposite sidewalls of each mandrel 520 have a width, $W_2$, that is less than the width, $W_1$, of each mandrel 520. The spacers on opposite sidewalls of each mandrel 520 are also spaced from one another by a pitch, $P_2$, that is less than the pitch, $P_1$, of the mandrels 520. As further described below, the spacers 530 are used to form the fin structures of the integrated circuit device 500, such that the pitch, $P_2$, and the width, $W_2$, of the spacers 530 define the width and the pitch of various fin structures of the integrated circuit device 500.

Figure 5D:
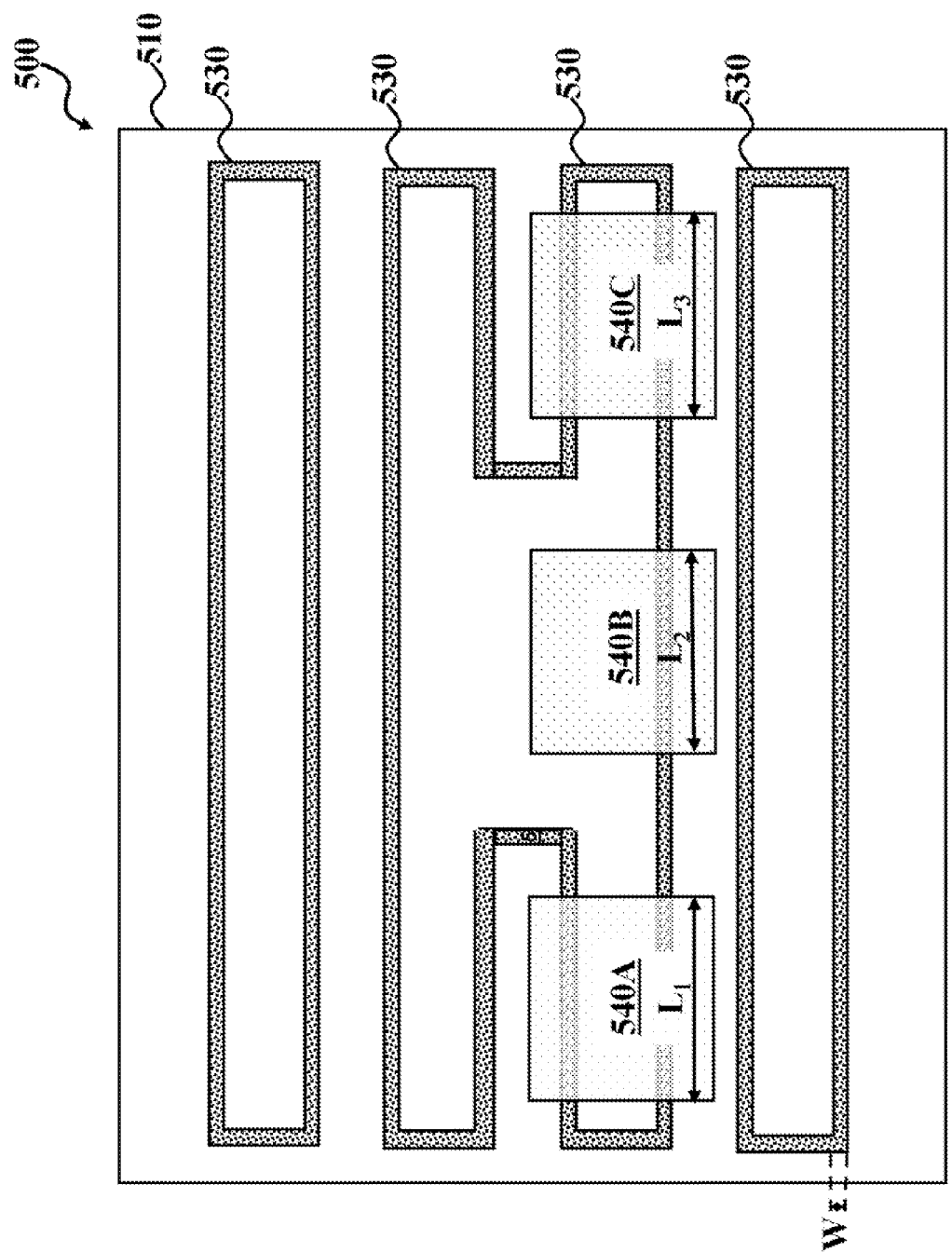

In FIGS. 5D-5G, a second or trim (or cut) masking process is performed to define lengths of the fins of the various fin structures of the integrated circuit device 500. In FIG. 5D, a trim masking layer that includes array of trim mask portions 540A, 540B, and 540C is disposed over the substrate 510. Each trim mask portion 540A, 540B, and 540C defines a FinFET device area of the integrated circuit device 500. More specifically, in the depicted embodiment, each trim mask portion 540A, 540B, and 540C defines a number of fins that a fin structure of a FinFET device of the integrated circuit device 500 will include and a length of the fins of the fin structure of the respective FinFET device (such as length, $L_1$; length, $L_2$; and length, $L_3$). The trim masking layer 540 includes a patterning or masking material, such as a resist material, polysilicon, silicon oxide, silicon nitride, other patterning or masking material, or combinations thereof. In the depicted embodiment, the trim masking layer 540 includes a resist material. In an example, forming the trim masking layer 540 includes depositing a resist layer over the substrate 510; using a trim mask (which may be referred to as an active region mask) to expose the resist layer to radiation, thereby forming exposed portions of the resist layer and unexposed portions of the resist layer; removing the exposed portions or unexposed portions of the resist layer (for example, by subjecting the exposed resist layer to a developing solution), thereby forming a patterned resist layer, specifically the trim masking layer 540 as illustrated in FIG. 5D that provides unexposed portions of the spacers 530 and exposed portions of the spacers 530. In the depicted embodiment, the trim mask used to form the trim masking layer 540 is fabricated based on the trim mask layout (which includes the masking features 210) associated with the integrated circuit design layout 400 of FIG. 4. The trim masking layer 540 includes the trim mask portions 540A, 540B, and 540C that covers portions of the spacers 530, thereby providing the unexposed portions of the spacers 530. In other examples, the trim masking layer 540 is formed by various deposition processes, lithography processes, etching processes, or combinations thereof, such as the processes described herein.

Figure 5F:
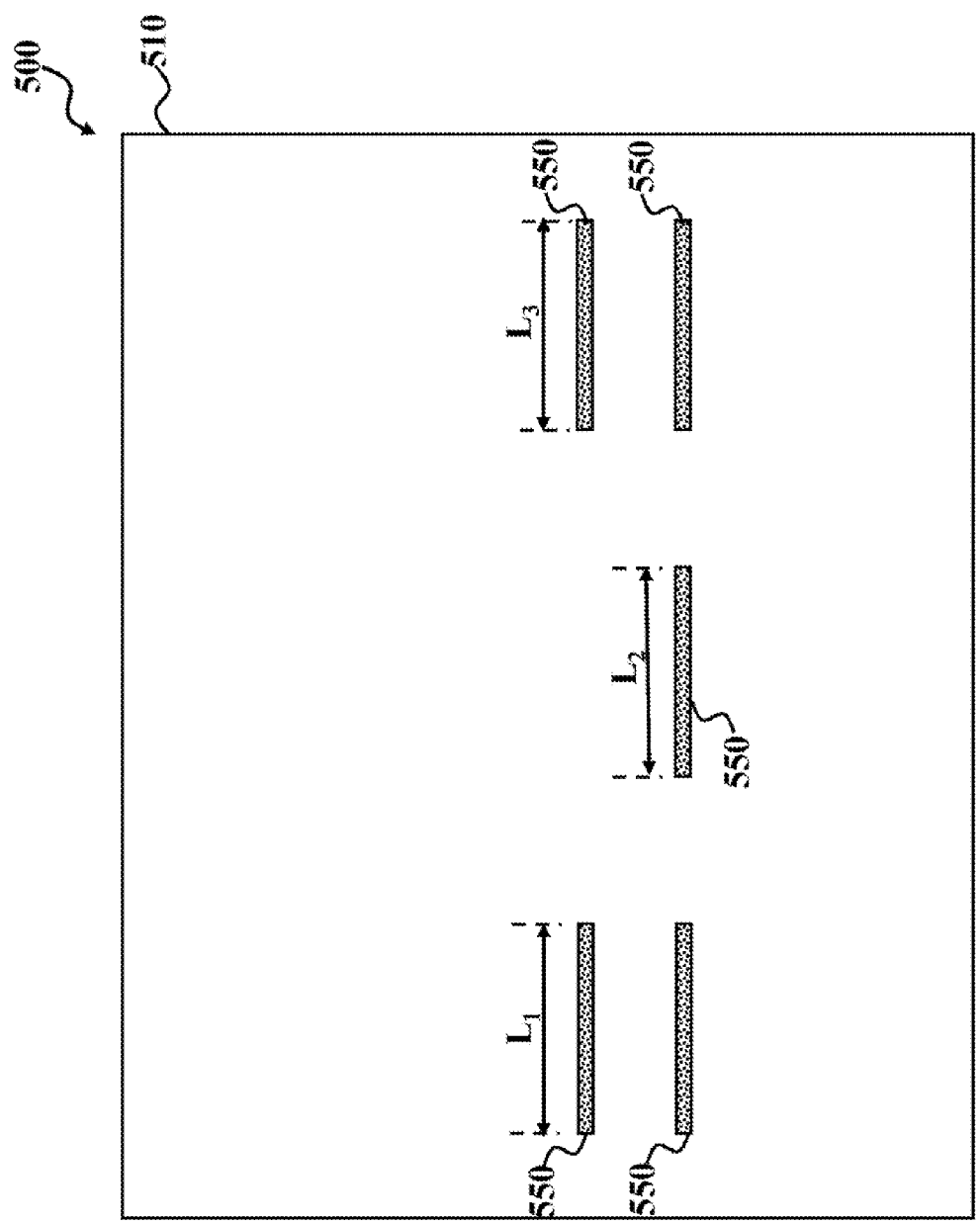
Figure 5G:
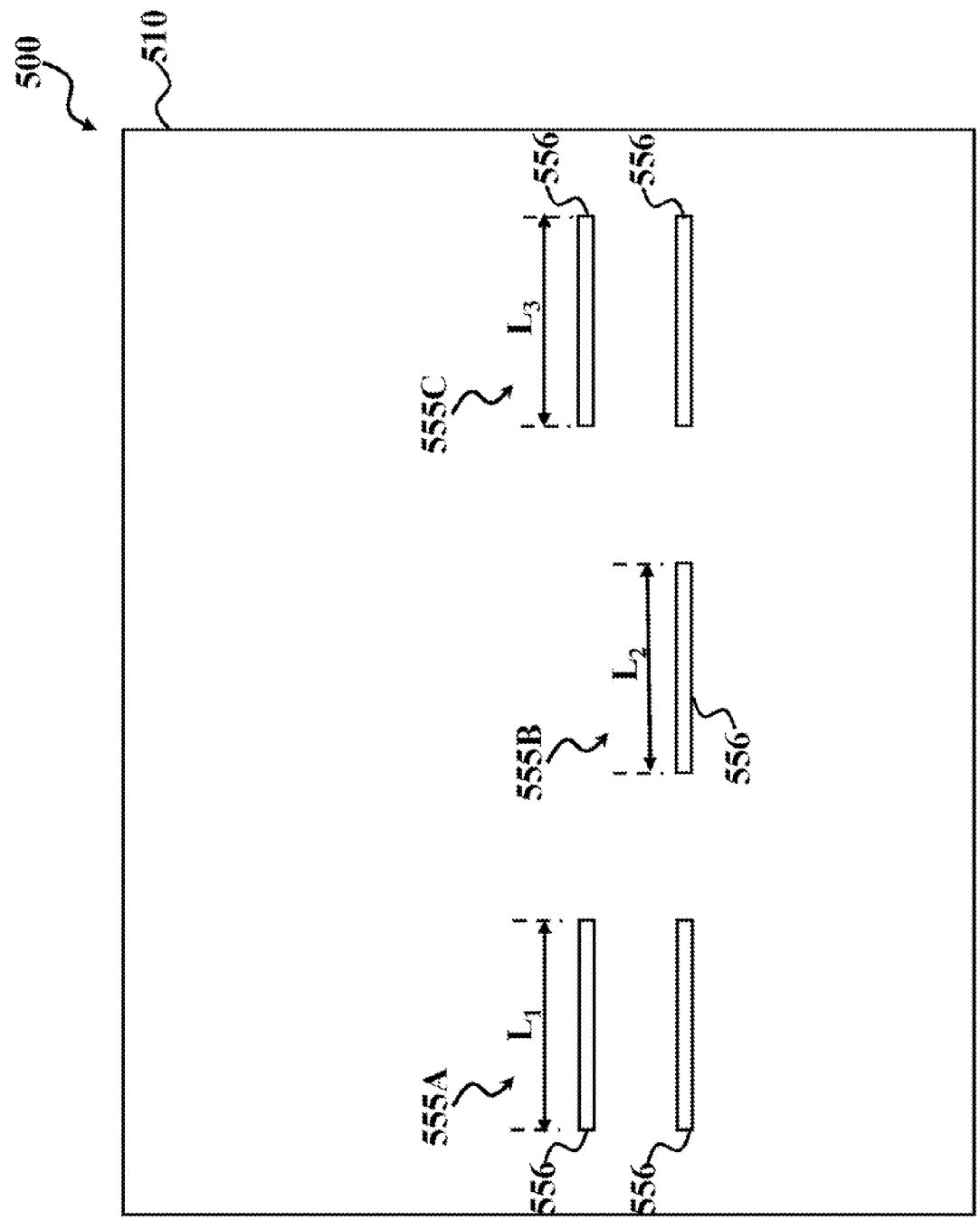

In FIG. 5E, the exposed portions of the spacers 530 are removed, for example, by an etching process; and in FIG. 5F, the trim masking layer 540 is removed, leaving spacer segments 550 disposed over the substrate 510. Each spacer segment 550 has the width, $W_2$; adjacent spacer segments 550 are spaced by the pitch, $P_2$; and each spacer segment 550 has the length, $L_1$, length, $L_2$, or length, $L_3$. The spacer segments 550 leave exposed portions of the substrate 510 and unexposed portions of the substrate 510. In FIG. 5G, the spacer segments 550 are used as a mask to remove the exposed portions of the substrate 510 (for example, by an etching process), thereby forming FinFET device areas 555A, 555B, and 555C. Each FinFET device area 555A, 555B, and 555C includes a fin structure having fins 556 that extend from the substrate 510. In the depicted embodiment, the FinFET device area 555A includes a fin structure having two fins 556 having the length, $L_1$; the FinFET device area 555B includes a fin structure having one fin 556 having the length, $L_2$; and the FinFET device area 555C includes a fin structure having two fins 556 having the length, $L_3$. The integrated circuit device 500 thus includes a FinFET device in the FinFET device area 555B that includes a fin structure with one fin 556 (which may be referred to as a single fin FinFET device). The single fin FinFET device is achieved by modifying the mandrels, such that the trim mask portion that typically defines two fins instead defines a single fin. Subsequent processing can be performed to complete fabrication of the integrated circuit device 500, such as that described above (for example, various gate structures, epitaxial features, conductive features, and other features may be formed).

The present disclosure provides for many different embodiments. An exemplary method includes providing a main mask layout and a trim mask layout to form fins of a fin-like field effect transistor (FinFET) device, wherein the main mask layout includes a first masking feature and the trim mask layout includes a second masking feature that defines at least two fins, the first masking feature and the second masking feature having a spatial relationship; and modifying the main mask layout based on the spatial relationship between the first masking feature and the second masking feature, wherein the modifying the main mask layout includes modifying the first masking feature such that a single fin FinFET device is formed using the modified main mask layout and the trim mask layout. The method may further include fabricating a main mask based on the modified main mask layout and fabricating a trim mask based on the trim mask layout. The method may further include forming the single fin FinFET device using the main mask and the trim mask.

In an example, the first masking feature defines a first mandrel feature and a second mandrel feature, where the first mandrel feature is spaced a distance from the second mandrel feature; and the second masking feature has a width that is greater than the distance between the first mandrel feature and the second mandrel feature, such that the spatial relationship between the first masking feature and the second masking feature includes the second masking feature overlapping a portion of the first mandrel feature and a portion of the second mandrel feature. The distance may be about equal to $D_{fin}+2W_{fin}$, where $D_{fin}$ is a distance between two adjacent fins and $W_{fin}$ is a width of a fin; and the width may be about equal to $2D_{fin}+2W_{fin}$. In an example, modifying the first masking feature includes removing one of the portion of the first mandrel feature and the portion of the second mandrel feature. A supplementary mandrel feature may be added to the other one of the portion of the first mandrel feature and the portion of the second mandrel feature. The supplementary mandrel feature may have a length greater than a length of the second masking feature. In another example, the first mandrel feature defines a first mandrel feature and a second mandrel feature, wherein the first mandrel feature is spaced a distance from the second mandrel feature and the first mandrel feature and the second mandrel feature have a first width; and the second masking feature has a second width that is greater than the first width, such that the spatial relationship between the first masking feature and the second masking feature includes the second masking feature overlapping a portion of the first width of the first mandrel feature. The first width may be about equal to a distance between two adjacent fins ($D_{fin}$); and the second width may be about equal to $2D_{fin}+2W_{fin}$, where $W_{fin}$ is a width of a fin. In an example, modifying the first masking feature includes merging a portion of the second masking feature with the portion of the first width of the first mandrel feature.

Another exemplary method includes providing a trim mask feature having a length ($L_{trim}$) that defines a length of a fin ($L_{fin}$) and a width ($W_{trim}$) that is equal to about $W_{trim}=2(D_{fin}+W_{fin})$, where $D_{fin}$ is a distance between two adjacent fins and $W_{fin}$ is a width of the fin; modifying a mandrel mask feature based on a spatial relationship between the mandrel mask feature and the trim mask feature; and forming a single fin fin-like field effect transistor (FinFET) device using the modified mandrel mask feature and the trim mask feature. In an example, the mandrel mask feature includes a first mandrel feature and a second mandrel feature; the spatial relationship between the mandrel mask feature and the trim mask feature includes the trim mask feature overlapping a portion of the first mandrel feature, a portion of the second mandrel feature, and a distance between the portion of the first mandrel feature and the portion of the second mandrel feature, the distance being equal to about $D_{fin}+2W_{fin}$; and the modifying the mandrel mask feature based on the spatial relationship between the mandrel mask feature and the trim mask feature includes removing one of the portion of the first mandrel feature and the portion of the second mandrel feature. A supplementary mandrel feature may be added to the other one of the portion of the first mandrel feature and the portion of the second mandrel feature. The supplementary mandrel feature may have a length greater than the length ($L_{trim}$) of the trim mask feature and a width substantially equal to the width of the fin ($W_{fin}$). In another example, the mandrel mask feature includes a first mandrel feature and a second mandrel feature; the spatial relationship between the mandrel mask feature and the trim mask feature includes the trim mask feature overlapping a portion of the first mandrel feature that has a width equal to about the distance between two adjacent fins ($D_{fin}$); and the modifying the mandrel mask feature based on the spatial relationship between the mandrel mask feature and the trim mask feature includes merging the portion of the first mandrel feature with a portion of the second mandrel feature. A merged mandrel feature portion may merge the portion of the first mandrel feature with the portion of the second mandrel feature, where the merged mandrel feature portion has a width that is equal to about $D_{fin}+2W_{fin}$.

In yet another example, a method includes modifying a mandrel mask feature based on a spatial relationship between a mandrel mask feature and a trim mask feature that defines at least two fins; and forming a fin of a fin fin-like field effect transistor (FinFET) device using the modified mandrel mask feature and the trim mask feature that defines the at least two fins. The mandrel mask feature defines a first mandrel and a second mandrel. Modifying the mandrel mask feature may include removing one of a portion of the first mandrel and a portion of the second mandrel. Modifying the mandrel mask feature may include merging a portion of the first mandrel and a portion of the second mandrel.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method comprising:
providing a main mask layout and a trim mask layout to form fins of a fin-like field effect transistor (FinFET) device, wherein the main mask layout includes a first masking feature and the trim mask layout includes a second masking feature that defines at least two fins, the first masking feature and the second masking feature having a spatial relationship; and
modifying the main mask layout based on the spatial relationship between the first masking feature and the second masking feature, wherein the modifying the main mask layout includes modifying the first masking feature such that a single fin FinFET device is formed using the modified main mask layout and the trim mask layout.

2. The method of claim 1 wherein:
the first masking feature defines a first mandrel feature and a second mandrel feature, wherein the first mandrel feature is spaced a distance from the second mandrel feature; and
the second masking feature having a width that is greater than the distance between the first mandrel feature and the second mandrel feature, such that the spatial relationship between the first masking feature and the second masking feature includes the second masking feature overlapping a portion of the first mandrel feature and a portion of the second mandrel feature.

3. The method of claim 2 wherein the modifying the first masking feature includes removing one of the portion of the first mandrel feature and the portion of the second mandrel feature.

4. The method of claim 3 wherein the modifying the first masking feature further includes adding a supplementary mandrel feature to the other one of the portion of the first mandrel feature and the portion of the second mandrel feature.

5. The method of claim 4 wherein the supplementary mandrel feature has a length greater than a length of the second masking feature.

6. The method of claim 2 wherein:
the distance is equal to $D_{fin}+2W_{fin}$, where $D_{fin}$ is a distance between two adjacent fins and $W_{fin}$ is a width of a fin; and
the width is equal to $2D_{fin}+2W_{fin}$.

7. The method of claim 1 wherein:
the first masking feature defines a first mandrel feature and a second mandrel feature, wherein the first mandrel feature is spaced a distance from the second mandrel feature and the first mandrel feature and the second mandrel feature have a first width; and
the second masking feature has a second width that is greater than the first width, such that the spatial relationship between the first masking feature and the second masking feature includes the second masking feature overlapping a portion of the first width of the first mandrel feature.

8. The method of claim 7 wherein the modifying the first masking feature includes merging a portion of the second masking feature with the portion of the first width of the first mandrel feature.

9. The method of claim 7 wherein:
the first width is equal to a distance between two adjacent fins ($D_{fin}$); and
the second width is equal to $2D_{fin}+2W_{fin}$, where $W_{fin}$ is a width of a fin.

10. The method of claim 1 further including:
fabricating a main mask based on the modified main mask layout; and
fabricating a trim mask based on the trim mask layout.

11. The method of claim 10 further including forming the single fin FinFET device using the main mask and the trim mask.

12. A method comprising:
providing a trim mask feature having a length ($L_{trim}$) that defines a length of a fin ($L_{fin}$) and a width ($W_{trim}$) that is equal to:

$$W_{trim}=2(D_{fin}+W_{fin})$$

where $D_{fin}$ is a distance between two adjacent fins and $W_{fin}$ is a width of the fin;
modifying a mandrel mask feature based on a spatial relationship between the mandrel mask feature and the trim mask feature; and
forming a single fin fin-like field effect transistor (FinFET) device using the modified mandrel mask feature and the trim mask feature.

13. The method of claim 12 wherein:
the mandrel mask feature includes a first mandrel feature and a second mandrel feature;
the spatial relationship between the mandrel mask feature and the trim mask feature includes the trim mask feature overlapping a portion of the first mandrel feature, a portion of the second mandrel feature, and a distance between the portion of the first mandrel feature and the portion of the second mandrel feature, the distance being equal to $D_{fin}+2W_{fin}$; and
the modifying the mandrel mask feature based on the spatial relationship between the mandrel mask feature and the trim mask feature includes removing one of the portion of the first mandrel feature and the portion of the second mandrel feature.

14. The method of claim 13 wherein the modifying the mandrel mask feature based on the spatial relationship between the mandrel mask feature and the trim mask feature further includes adding a supplementary mandrel feature to the other one of the portion of the first mandrel feature and the portion of the second mandrel feature.

15. The method of claim 14 wherein the supplementary mandrel feature has a length greater than the length ($L_{trim}$) of the trim mask feature.

16. The method of claim 14 wherein the supplementary mandrel feature has a width equal to the width of the fin ($W_{fin}$).

17. The method of claim 12 wherein:
the mandrel mask feature includes a first mandrel feature and a second mandrel feature;
the spatial relationship between the mandrel mask feature and the trim mask feature includes the trim mask feature overlapping a portion of the first mandrel feature that has a width equal to the distance between two adjacent fins ($D_{fin}$); and
the modifying the mandrel mask feature based on the spatial relationship between the mandrel mask feature and the trim mask feature includes merging the portion of the first mandrel feature with a portion of the second mandrel feature.

18. The method of claim 17 wherein a merged mandrel feature portion merges the portion of the first mandrel feature with the portion of the second mandrel feature, the merged mandrel feature portion having a width that is equal to $D_{fin}+2W_{fin}$.

19. A method comprising:
modifying a mandrel mask feature based on a spatial relationship between a mandrel mask feature and a trim mask feature that defines at least two fins; and
forming a fin-like field effect transistor (FinFET) device having only a single fin using the modified mandrel mask feature and the trim mask feature that defines the at least two fins.

20. The method of claim 19 wherein:
the mandrel mask feature defines a first mandrel and a second mandrel; and
the modifying the mandrel mask feature includes one of:
removing one of a portion of the first mandrel and a portion of the second mandrel, and
merging a portion of the first mandrel and a portion of the second mandrel.

* * * * *